(12) United States Patent
Lim

(10) Patent No.: US 11,943,552 B2
(45) Date of Patent: Mar. 26, 2024

(54) DEPTH SENSOR AND IMAGE DETECTING SYSTEM INCLUDING THE SAME

(71) Applicant: SAMSUNG ELECTRONICS CO., LTD., Suwon-si (KR)

(72) Inventor: Jungwook Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 17/719,649

(22) Filed: Apr. 13, 2022

(65) Prior Publication Data

US 2023/0007200 A1 Jan. 5, 2023

(30) Foreign Application Priority Data

Jul. 1, 2021 (KR) .......................... 10-2021-0086523

(51) Int. Cl.
*H04N 25/705* (2023.01)
*H01L 27/146* (2006.01)

(52) U.S. Cl.
CPC ..... *H04N 25/705* (2023.01); *H01L 27/14614* (2013.01); *H01L 27/14616* (2013.01); *H01L 27/1463* (2013.01); *H01L 27/14643* (2013.01)

(58) Field of Classification Search
CPC .... G01S 7/4863; G01S 7/4816; G01S 7/4865; G01S 17/894; H04N 25/771; H04N 25/705; H01L 27/14616; H01L 27/1463; H01L 27/14643; H01L 27/14614
USPC ....................................................... 348/308
See application file for complete search history.

(56) References Cited

U.S. PATENT DOCUMENTS

| | | | |
|---|---|---|---|
| 7,787,038 B2 | 8/2010 | Mabuchi | |
| 7,889,257 B2* | 2/2011 | Oggier | G01S 17/894 348/297 |
| 7,910,872 B2 | 3/2011 | Kim et al. | |
| 8,642,938 B2* | 2/2014 | Bikumandla | G01S 7/4863 356/3.04 |
| 8,937,711 B2* | 1/2015 | Kim | G01S 17/48 356/5.01 |
| 9,324,758 B2 | 4/2016 | Oh et al. | |
| 9,591,245 B2 | 3/2017 | Madurawe | |
| 9,621,827 B2 | 4/2017 | Mabuchi et al. | |
| 10,014,336 B2* | 7/2018 | Agranov | H01L 27/14605 |
| 10,840,284 B2* | 11/2020 | Ennoji | H01L 27/14623 |

(Continued)

FOREIGN PATENT DOCUMENTS

KR 10-0321769 B1 4/2002

*Primary Examiner* — Pritham D Prabhakher
(74) *Attorney, Agent, or Firm* — Sughrue Mion, PLLC

(57) ABSTRACT

A depth sensor and an image detecting system including the same are provided. The depth sensor includes a pixel that generates an image signal based on a sensed light. The pixel includes a first photo transistor that integrates first charges based on a first photo gate signal toggling during an integration period, a second photo transistor that integrates second charges based on a second photo gate signal toggling during the integration period, a first transfer transistor that transfers the first charges to a first floating diffusion node based on a first transfer gate signal, a second transfer transistor that transfers the second charges to a second floating diffusion node based on the first transfer gate signal, and a switch that is connected with the first photo transistor, the second photo transistor, the first transfer transistor, and the second transfer transistor.

20 Claims, 17 Drawing Sheets

(56) References Cited

U.S. PATENT DOCUMENTS

| | | | |
|---|---|---|---|
| 11,032,496 B2* | 6/2021 | Webster | H01L 27/14603 |
| 11,082,652 B2* | 8/2021 | Jin | H04N 25/705 |
| 11,627,266 B2* | 4/2023 | Jin | G01S 7/4914 |
| | | | 348/140 |
| 11,695,025 B2* | 7/2023 | Jang | G01S 7/4863 |
| | | | 257/291 |
| 11,798,973 B2* | 10/2023 | Jin | H01L 27/1464 |
| 2011/0199602 A1* | 8/2011 | Kim | G01C 3/08 |
| | | | 257/225 |
| 2015/0070553 A1 | 3/2015 | Lee et al. | |
| 2019/0281241 A1* | 9/2019 | Jin | H04N 25/622 |
| 2020/0393549 A1* | 12/2020 | Jin | H04N 25/771 |
| 2021/0297617 A1* | 9/2021 | Eshel | G01S 7/4863 |
| 2021/0335868 A1* | 10/2021 | Park | H04N 25/77 |
| 2021/0368122 A1* | 11/2021 | Jang | G01S 7/4816 |
| 2022/0021831 A1* | 1/2022 | Jin | G01S 7/493 |
| 2022/0124276 A1* | 4/2022 | Song | H04N 25/745 |

* cited by examiner

DEPTH SENSOR AND IMAGE DETECTING SYSTEM INCLUDING THE SAME

CROSS-REFERENCE TO RELATED APPLICATION

This application is based on and claims priority under 35 U.S.C. § 119 to Korean Patent Application No. 10-2021-0086523 filed on Jul. 1, 2021, in the Korean Intellectual Property Office, the disclosure of which is incorporated by reference herein in its entirety.

BACKGROUND

The present disclosure relates to image processing and object distance calculation, and more particularly, relates to a depth sensor and an image detecting system including the same.

Various electronic devices including a smartphone are equipped with an image sensor. The image sensor may include a charge coupled device (CCD) image sensor or a CMOS image sensor (CIS). Nowadays, the image sensor may be implemented to perform not only to capture an external image for display, but also to calculate a distance of an object and recognize the object.

A time of flight (TOF) based image detecting system may be implemented to calculate a distance between the sensing system and the object by using an image sensor including a depth sensor. The image detecting system may include a light source. A light output from the light source may be reflected by the object, the reflected light may be provided to the depth sensor, and a depth of the object may be calculated by using the reflected light. However, internal factors of the depth sensor, such as a limitation on a structure of a pixel, may cause an error in calculating a distance of an object. Accordingly, there is a need to minimize errors due to the internal factors.

SUMMARY

Embodiments of the present disclosure provide a depth sensor operating at a low power by minimizing errors related to a time of flight (ToF) calculation and reducing a driving current of a row driver at the same time, and an image detecting system including the depth sensor.

According to an embodiment, there is provided a depth sensor including a pixel configured to generate an image signal based on a sensed light. The pixel includes: a first photo transistor configured to integrate first charges based on a first photo gate signal that toggles during an integration period; a second photo transistor configured to integrate second charges based on a second photo gate signal that toggles during the integration period; a first transfer transistor connected with the first photo transistor, and configured to transfer the first charges to a first floating diffusion node based on a first transfer gate signal; a second transfer transistor connected with the second photo transistor, and configured to transfer the second charges to a second floating diffusion node based on the first transfer gate signal; and a switch connected to a node to which the first photo transistor, the second photo transistor, the first transfer transistor, and the second transfer transistor are connected, and configured to control a voltage to be applied to the first photo transistor, the second photo transistor, the first transfer transistor, and the second transfer transistor.

According to an embodiment, there is provided a depth sensor including a pixel configured to generate an image signal based on a sensed light. The pixel includes: a first photo gate electrode configured to receive a first photo gate signal that toggles during an integration period to integrate first charges in a light detecting area; a second photo gate electrode configured to receive a second photo gate signal that toggles during the integration period to integrate second charges in the light detecting area; a first transfer gate electrode disposed to be spaced apart from the first photo gate electrode in a first direction, and configured to receive a first transfer gate signal to transfer the first charges to a first floating diffusion node; a second transfer gate electrode disposed to be spaced apart from the second photo gate electrode in a direction facing away from the first direction, and configured to receive the first transfer gate signal to transfer the second charges to a second floating diffusion node; and a substrate includes the light detecting area, the first floating diffusion node, and the second floating diffusion node, wherein a negative voltage is applied to the substrate during the integration period.

According to an embodiment, there is provided an image detecting system including: a light source configured to output an emission light based on a first clock signal; a depth sensor includes a pixel and configured to generate an image signal by sensing the emission light reflected from an object based on the first clock signal and a second clock signal complementary to the first clock signal during an integration period; and a processor configured to calculate a distance between the depth sensor and the object based on the image signal. The pixel includes: a first photo transistor configured to integrate first charges based on a first photo gate signal that toggles during the integration period; a second photo transistor configured to integrate second charges based on a second photo gate signal that toggles during the integration period; a first transfer transistor connected with the first photo transistor, and configured to transfer the first charges to a first floating diffusion node based on a first transfer gate signal; a second transfer transistor connected with the second photo transistor, and configured to transfer the second charges to a second floating diffusion node based on the first transfer gate signal; and a switch connected to a node to which the first photo transistor, the second photo transistor, the first transfer transistor, and the second transfer transistor are connected, and configured to control a voltage to be applied to the first photo transistor, the second photo transistor, the first transfer transistor, and the second transfer transistor.

BRIEF DESCRIPTION OF THE DRAWINGS

The above and other aspects and features of the present disclosure will become apparent from the following description taken in conjunction with the accompanying drawings.

DETAILED DESCRIPTION

Hereinafter, embodiments of the present disclosure will be described in detail and clearly to such an extent that one skilled in the art may understand and practice the present disclosure.

Figure 1:
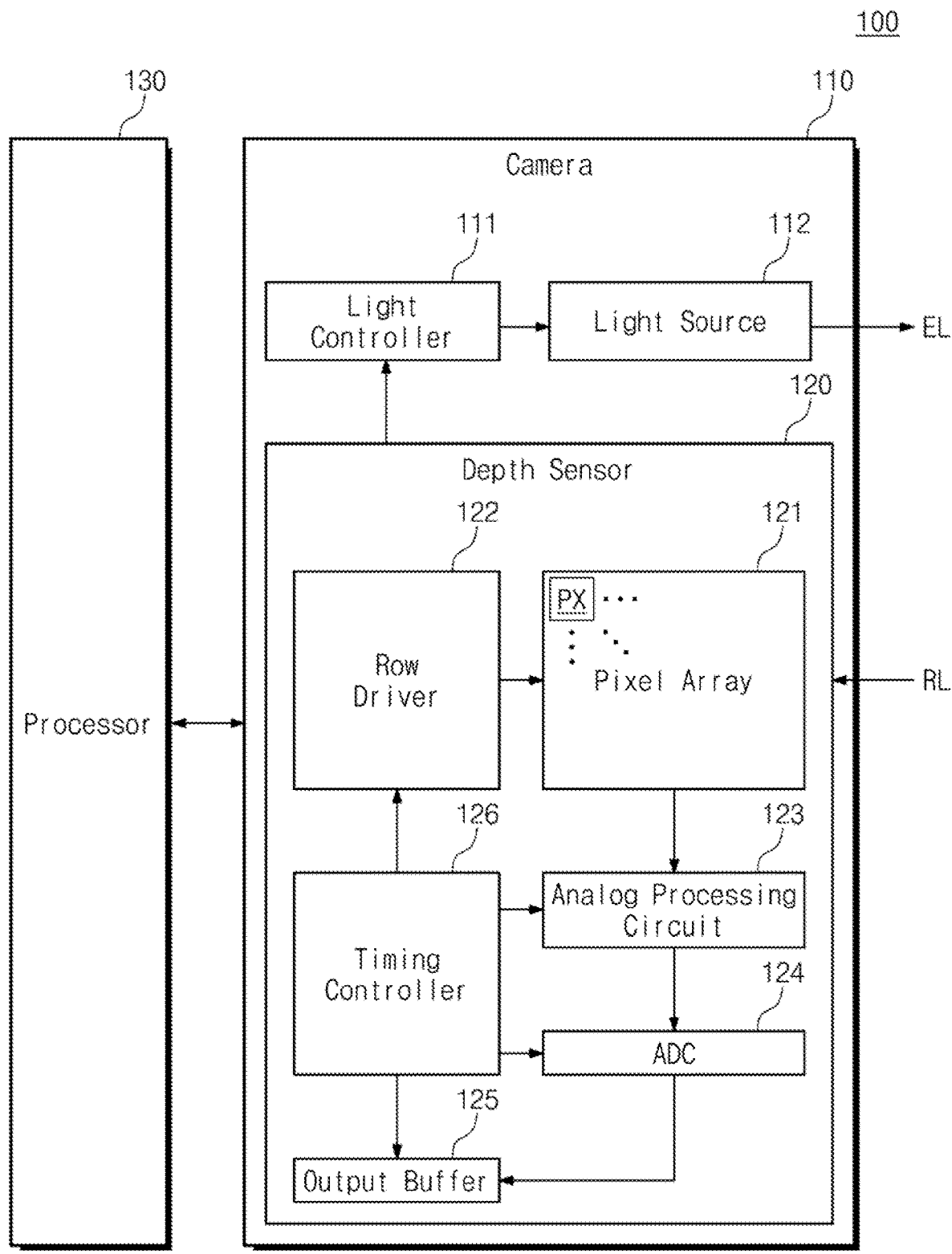
FIG. 1 is a block diagram of an electronic device, according to an embodiment.

FIG. 1 is a block diagram of an image detecting system according to an embodiment of the present disclosure. An image detecting system 100 may be also referred to as an "electronic device", an "electronic system", or a "distance detecting system". For example, the electronic device may be a smartphone, a tablet, a digital camera, a wearable device, or a mobile device. The image detecting system 100 may include a camera 110 and a processor 130.

The camera 110 may emit a light signal EL to an object based on a time of flight (ToF) technology, may sense a light signal RL reflected from the object, and may sense a distance between the camera 110 and the object. The camera 110 may include a light controller 111, a light source 112, and a depth sensor 120.

The light controller 111 may control the light source 112 under control of the depth sensor 120 or the processor 130. The light controller 111 may modulate the light signal EL to be emitted or output from the light source 112. The light source 112 may emit the light signal EL modulated by the light controller 111. For example, the modulated light signal EL may have the shape of a square wave (or pulse) or a sine wave, and the light signal EL may be an infrared, a microwave, a light wave, or an ultrasonic wave. For example, the light source 112 may include a light emitting diode (LED), a laser diode (LD), or an organic light emitting diode (OLED).

The depth sensor 120 may be also referred to as an "image sensor" or a "TOF sensor". The depth sensor 120 may include a pixel array 121, a row driver 122, an analog processing circuit 123, an analog-to-digital converter (ADC) 124, an output buffer 125, and a timing controller 126.

The pixel array 121 may include pixels PX arranged along a row direction and a column direction. The pixel array 121 may be implemented on a silicon substrate or a semiconductor substrate. The pixels PX may convert the light signal RL reflected from an object into an electrical signal. Due to a distance between the depth sensor 120 and the object, the light signal RL incident on the pixel array 121 may be delayed with respect to the light signal EL output from the light source 112. There may be a time difference between the light signals RL and EL. The pixel PX may integrate, store, transfer, or remove charges based on control signals provided from the row driver 122. The pixel PX may be also referred to as a "ToF pixel".

The row driver 122 may control the pixel array 121 under control of the timing controller 126. The row driver 122 may provide the control signals to the pixels PX. For example, the control signals may include OG, PG, TG, SG, RG, SEL, CTRL, and CTRLB illustrated in FIGS. 2A to 11. The row driver 122 may control all the pixels PX of the pixel array 121 at the same time in a global mode or may control the pixels PX of the pixel array 121 in the unit of row in a rolling mode. The row driver 122 may control a toggling operation of all the pixels PX in the global mode.

The analog processing circuit 123 may receive, sample, and hold an output signal (also referred to as an "image signal" or a "depth signal") output from the pixel array 121. The analog processing circuit 123 may be connected with the pixels PX of the pixel array 121 and may control output lines extending in the column direction. The analog processing circuit 123 may perform a correlated double sampling (CDS) operation on the output signal and may remove a noise included in the output signal.

For example, the analog processing circuit 123 may compare a reset signal generated based on a reset operation of each pixel PX with an image signal. The analog processing circuit 123 may remove a noise included in the image signal based on a difference between the reset signal and the image signal. The analog processing circuit 123 may output the noise-free image signal to the analog-to-digital converter (ADC) 124 in units of column, under control of the timing controller 126.

The analog-to-digital converter 124 may convert the output signal processed by the analog processing circuit 123 into a digital signal. The analog-to-digital converter 124 may organize image data (or depth data) by using the digital signal. The analog-to-digital converter 124 may provide the image data to the output buffer 125. For example, the analog-to-digital converter 124 may be included or integrated in the analog processing circuit 123.

The output buffer 125 may store the image data output from the analog-to-digital converter 124. The output buffer 125 may output the image data to the processor 130.

The timing controller 126 may control the pixel array 121, the row driver 122, the analog processing circuit 123, the ADC 124, and the output buffer 125 of the depth sensor 120. The timing controller 126 may control the light controller 111 under control of the processor 130. For example, the timing controller 126 may control the row driver 122 based on modulation information or phase information of the light signal EL to be output from the light source 112. Under control of the timing controller 126, the row driver 122 may transmit, to the pixel PX, a first modulation signal (or a first photo gate signal), the phase of which is the same as or different from a phase of the light signal EL, and a second modulation signal (or a second photo gate signal), the phase of which is different from the phase of the first modulation signal.

The depth sensor 120 may generate first image data by using the first photo gate signal and may generate second image data by using the second photo gate signal. The depth sensor 120 may send the first and second image data to the processor 130. However, the embodiments of the disclosure are not limited thereto, and the number of photo gate signals may be 2 or more.

The processor 130 may control the camera 110. The processor 130 may control the light controller 111 and the light source 112 such that the light signal EL is output. The processor 130 may control the depth sensor 120 such that the depth sensor 120 senses the light signal RL and generates the first and second image data. The processor 130 may calculate a distance (e.g., a TOF value) between the depth sensor 120 and an object, a shape of the object, a movement speed of the object, etc. based on the first and second image data. For example, the processor 130 may calculate a delay time of the light signal RL to the light signal EL based on image data that the depth sensor 120 generates by using two or more modulation signals being identical to or different from a phase difference with the light signal EL.

The processor 130 may include an image signal processor (ISP) for processing image data provided from the depth sensor 120. The processor 130 may be also referred to as a "host" or a "camera controller". For example, the processor 130 may be independent of the camera 110 as illustrated in FIG. 1. As another example, the processor 130 may be integrated in the camera 110 or the depth sensor 120.

Figure 2A:
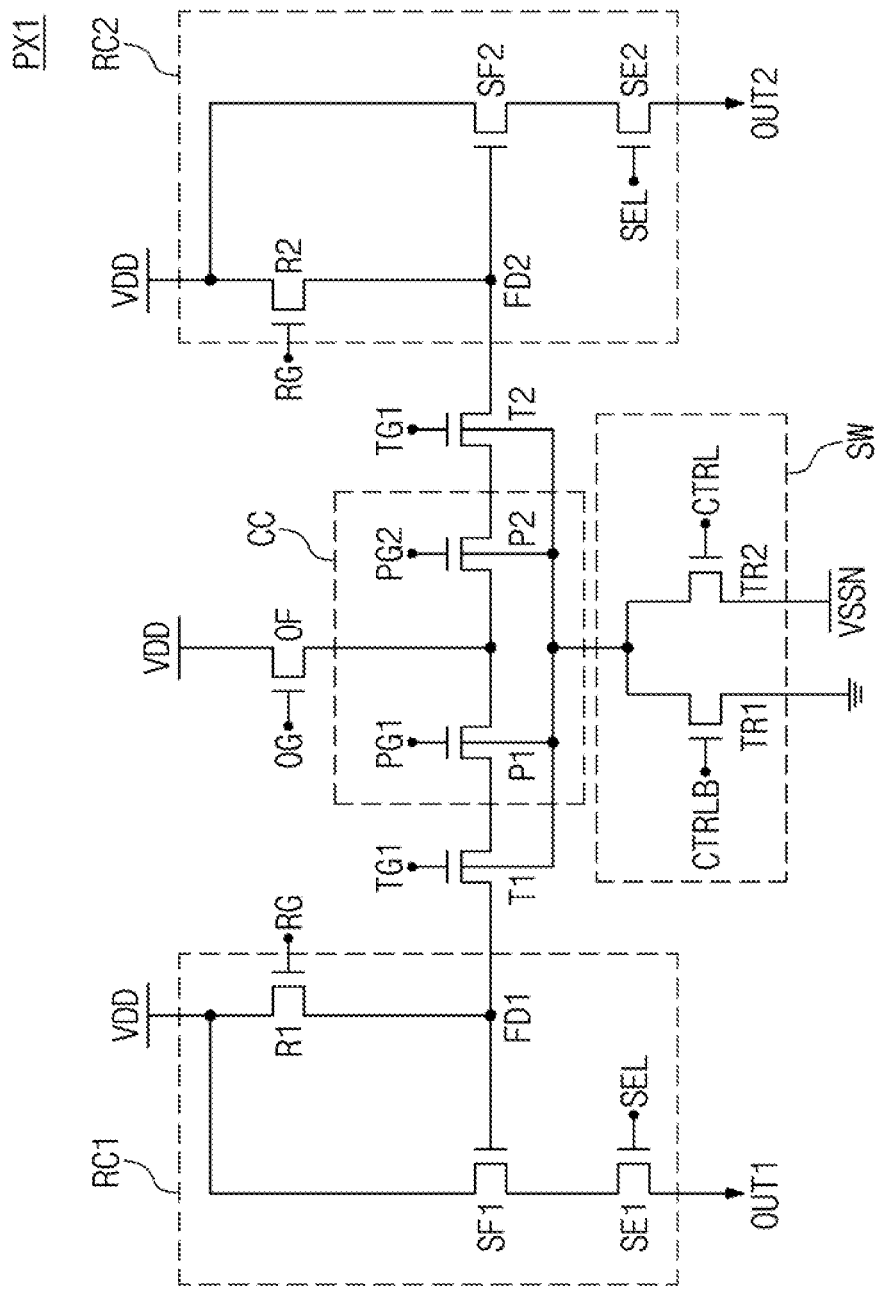
FIGS. 2A to 2C are views illustrating an example of a pixel according to an embodiment.
Figure 2B:
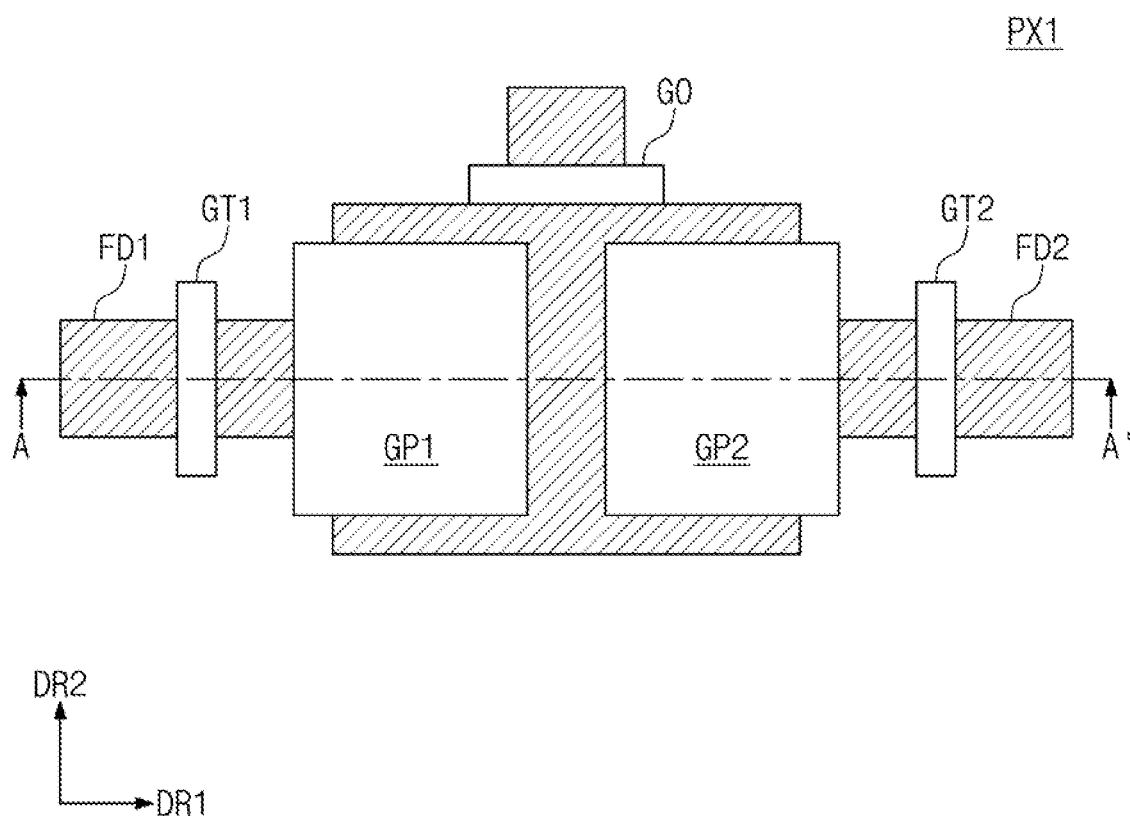
Figure 2C:
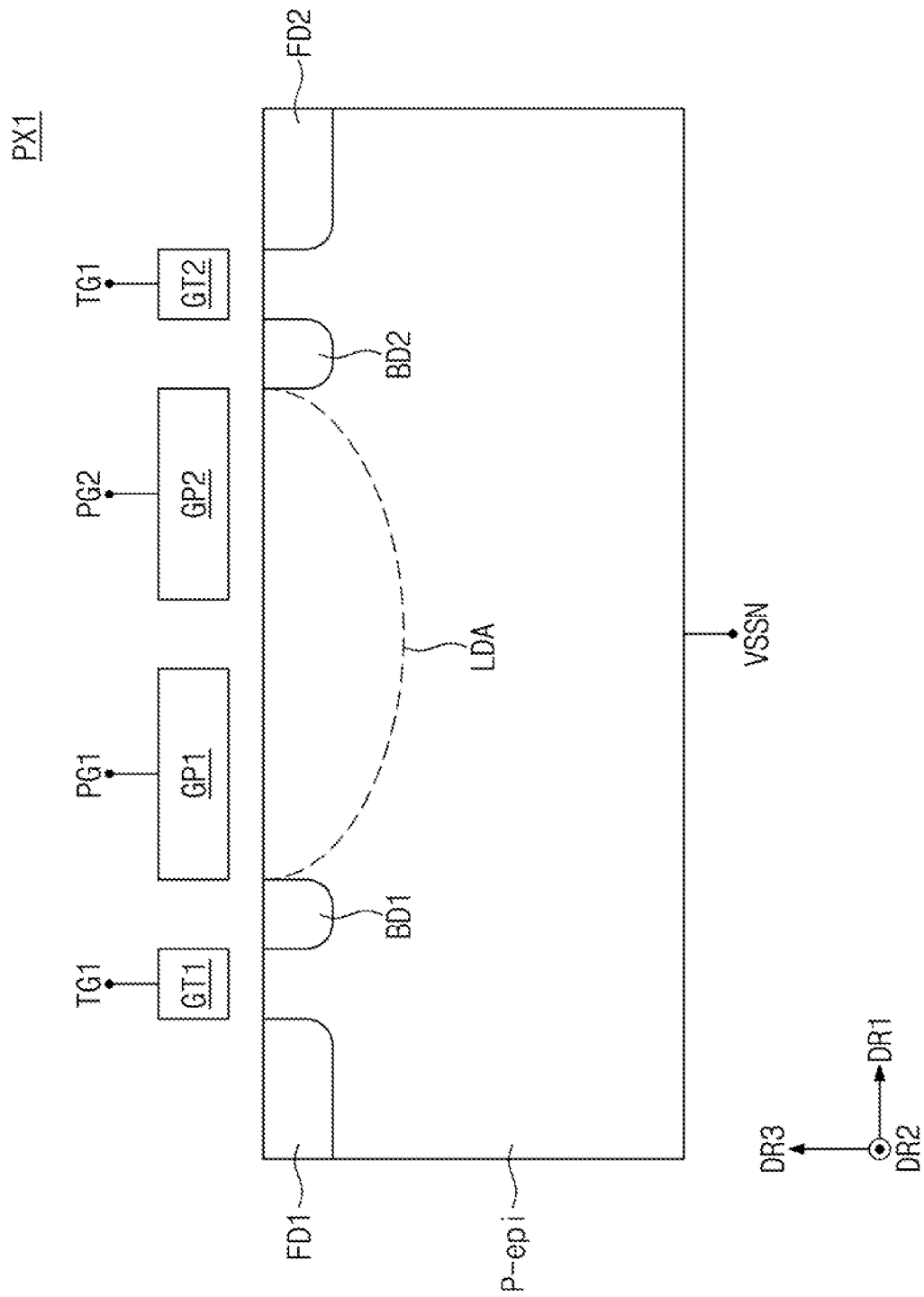

FIGS. 2A to 2C are views illustrating an example of the pixel PX of FIG. 1. FIG. 2A is a circuit diagram of a first pixel PX1 among the pixels PX of FIG. 1, FIG. 2B is a layout of the first pixel PX1, and FIG. 2C is a cross-sectional view of the first pixel PX1 taken along line A-A' of FIG. 2B.

Referring to FIGS. 1 and 2A, the first pixel PX1 may include a charge integration circuit CC, first and second transfer transistors T1 and T2, first and second read circuits RC1 and RC2, an overflow transistor OF, and a switch SW. For convenience of description, in the following embodiments, the description will be given under the condition that each of various transistors included in the pixels PX is turned on when a voltage of a high level is applied to a gate terminal thereof, like an NMOS transistor. However, the present disclosure is not limited thereto. For example, each of the transistors included in the pixels PXs may be turned on when a voltage of a low level is applied to a gate terminal thereof, like a PMOS transistor. That is, the kind of the transistors included in the pixels PX is not limited to the following description.

The charge integration circuit CC may be configured to integrate charges generated from light provided to the first pixel PX1. The light provided to the first pixel PX1 may be light that is reflected after an emission light is output from the light source 112 of FIG. 1. The charge integration circuit CC may include a first photo transistor P1 and a second photo transistor P2. During an integration period (or a sensing period), the first and second photo transistors P1 and P2 may integrate charges. A delay time of the emission light may be calculated based on the amount of charges (corresponding to the reflected light) that the first photo transistor P1 and the second photo transistor P2 integrate.

The first photo transistor P1 may integrate charges based on a first photo gate signal PG1. The first photo gate signal PG1 may toggle during the integration period. For example, the first photo gate signal PG1 may have the same phase as a clock signal for outputting the emission light. When the emission light is output, the first photo transistor P1 may sense light and may integrate first charges generated from the sensed light by the first photo transistor P1.

The second photo transistor P2 may integrate charges based on a second photo gate signal PG2. The second photo gate signal PG2 may toggle during the integration period. A phase of the second photo gate signal PG2 may be different from the phase of the first photo gate signal PG1. For example, the second photo gate signal PG2 and the clock signal for outputting the emission light may have a phase difference of 180 degrees. When the light source 112 of FIG. 1 does not output the emission light, the second photo transistor P2 may sense light and may integrate second charges generated from the sensed light by the second photo transistor P2.

According to an embodiment, the charge integration circuit CC may further include a third photo transistor integrating charges based on a third photo gate signal and a fourth photo transistor integrating charges based on a fourth photo gate signal. For example, the third photo gate signal and the clock signal may have a phase difference of 90 degrees, and the fourth photo gate signal and the clock signal may have a phase difference of 270 degrees. The first to fourth photo transistors may be connected in parallel. In this case, because reflected emission light is sensed depending on 4 phases, a distance between an object and an image sensor may be calculated more accurately.

The first and second transfer transistors T1 and T2 may control a transfer of the charges integrated from the charge integration circuit CC. The first transfer transistor T1 may control the transfer of the integrated first charges from the first photo transistor P1 to a first floating diffusion node FD1. The second transfer transistor T2 may control a transfer of the integrated second charges from the second photo transistor P2 to a second floating diffusion node FD2.

During the integration period, the first transfer transistor T1 may block the transfer of the first charges to the first floating diffusion node FD1 based on a first transfer gate signal TG1 of a low level. During the transfer period, the first transfer transistor T1 may transfer the first charges to the first floating diffusion node FD1 based on the first transfer gate signal TG1 of a high level. The first transfer transistor T1 may be connected in series between the first photo transistor P1 and the first floating diffusion node FD1.

Similar to the operations of the first transfer transistor T1, the second transfer transistor T2 may control the transfer of the second charges to the second floating diffusion node FD2 based on the first transfer gate signal TG1. For example, during the integration period, the second transfer transistor T2 may block the transfer of the second charges to the second floating diffusion node FD2 based on the first transfer gate signal TG1 of a low level. During the transfer period, the second transfer transistor T2 may transfer the second charges to the second floating diffusion node FD2 based on the first transfer gate signal TG1 of a high level. The second transfer transistor T2 may be connected in series between the second photo transistor P2 and the second floating diffusion node FD2.

The first read circuit RC1 may generate a first image signal OUT1 based on the charges stored at the first floating diffusion node FD1. The second read circuit RC2 may generate a second image signal OUT2 based on the charges stored at the second floating diffusion node FD2.

The first read circuit RC1 may include a first reset transistor R1, a first source follower transistor SF1, and a first select transistor SE1. The first reset transistor R1 may remove charges stored at the first floating diffusion node FD1 based on a reset gate signal RG. For example, before the integration period (or before charges are integrated by the first photo transistor P1 are transferred to the first floating diffusion node FD1 and/or after a read operation for the first image signal OUT1 is performed), a reset operation may be performed based on the reset gate signal RG of a high level. The first reset transistor R1 may be connected between a supply terminal of a power supply voltage VDD and the first floating diffusion node FD1.

The first source follower transistor SF1 may generate the first image signal OUT1 based on the charges stored at the first floating diffusion node FD1. A magnitude (e.g., a voltage level) of the first image signal OUT1 may be determined depending on the amount of charges stored at the first floating diffusion node FD1. The first source follower transistor SF1 may be connected between the supply terminal of the power supply voltage VDD and the first select transistor SE1.

The first select transistor SE1 may output the first image signal OUT1 based on a selection signal SEL. The first select transistor SE1 may output the first image signal OUT1 to a bit line connected with the first pixel PX1 based on the selection signal SEL of a high level. For the correlated double sampling operation of the analog processing circuit 123 of FIG. 1, the first select transistor SE1 may output a signal generated by the first floating diffusion node FD1 reset and the first image signal OUT1.

The second read circuit RC2 may include a second reset transistor R2, a second source follower transistor SF2, and a second select transistor SE2. The second reset transistor R2 may remove charges stored at the second floating diffusion node FD2, the second source follower transistor SF2 may generate a second image signal OUT2, and the second select transistor SE2 may output the second image signal OUT2. The second read circuit RC2 has substantially the same configuration as the first read circuit RC1, and thus, additional description will be omitted to avoid redundancy.

According to an embodiment, the first pixel PX1 may include one read circuit. For example, the second read circuit RC2 may be omitted, and a terminal of the second transfer transistor T2, which faces away from the second photo transistor P2, may be connected with the first floating diffusion node FD1. That is, charges integrated by the first and second photo transistors P1 and P2 may be transferred to the first floating diffusion node FD1 shared by the first and second photo transistors P1 and P2. In this case, the size of the first pixel PX1 may decrease.

In response to an overflow gate signal OG, the overflow transistor OF may remove charges integrated by the first and second photo transistors P1 and P2 during a time other than the integration period or may discharge the integrated charges to the power supply voltage VDD. The overflow transistor OF may be connected between the supply terminal of the power supply voltage VDD and a connection node of the first photo transistor P1 and the second photo transistor P2.

The switch SW may operate based on a switch control signal CTRL and an inverted switch control signal CTRLB. The switch SW may include a first transistor TR1 and a second transistor TR2. The first transistor TR1 may be turned on in response to the inverted switch control signal CTRLB, and the second transistor TR2 may be turned on in response to the switch control signal CTRL.

A first end of the first transistor TR1 may be connected to a node between the first and second photo transistors P1 and P2 and/or to a node between the first and second transfer transistors T1 and T2. A second end of the first transistor TR1 may be connected with a ground terminal. A first end of the second transistor TR2 may be connected to a node between the first and second photo transistors P1 and P2 and/or to a node between the first and second transfer transistors T1 and T2. A second end of the second transistor TR2 may be connected with a supply terminal of a negative voltage VSSN.

For example, when the switch control signal CTRL is at the low level, the inverted switch control signal CTRLB may be at the high level. In this case, the first transistor TR1 may be turned on, and the second transistor TR2 may be turned off. As such, a ground voltage may be applied to the node between the first and second photo transistors P1 and P2 and/or to the node between the first and second transfer transistors T1 and T2. When the switch control signal CTRL is at the high level, the inverted switch control signal CTRLB may be at the low level. In this case, the first transistor TR1 may be turned off, and the second transistor TR2 may be turned on. As such, the negative voltage VSSN may be applied to the node between the first and second photo transistors P1 and P2 and/or the node between the first and second transfer transistors T1 and T2.

The configuration of the switch SW is not limited to the embodiment shown in FIG. 2A. For example, the switch SW may be implemented with an SPDT switch. The SPDT switch may operate in response to the switch control signal CTRL. For example, the SPDT switch may be connected with the supply terminal of the negative voltage VSSN when the switch control signal CTRL is at the high level and may be connected with the ground terminal when the switch control signal CTRL is at the low level.

Referring to FIGS. 1, 2A, and 2B, the first pixel PX1 may include first and second photo gate electrodes GP1 and GP2 of the respective first and second photo transistors P1 and P2, first and second transfer gate electrodes GT1 and GT2 of the respective first and second transfer transistors T1 and T2, an overflow gate electrode GO of the overflow transistor OF, and the first and second floating diffusion nodes FD1 and FD2. The layout of the first pixel PXT may be understood as one example and is not limited thereto. In the accompanying drawings, a first direction DR1 and a second direction DR2 are defined as being perpendicular to a direction in which light is received. The first direction DR1 and the second direction DR2 are defined as being perpendicular to each other.

Hatched areas may include sources or drains of transistors illustrated in FIG. 2B. For example, the hatched areas that are adjacent to the first transfer gate electrode GT1 of the first transfer transistor T1 in the first direction DR1 may be a source and a drain of the first transfer transistor T1, respectively. However, the structure of the first and second photo transistors P1 and P2 may be distinguished from those of any other transistors, which will be described with reference to FIG. 2C.

The first and second photo gate electrodes GP1 and GP2 may be disposed at a central portion of the first pixel PX1. Each of the first and second photo gate electrodes GP1 and GP2 may have an area that is great enough to integrate charges generated by the sensed light. For example, the first and second photo gate electrodes GP1 and GP2 may be of the same size and each may be formed to have an area having the greatest size from among areas of other components included in the first pixel PX1. The first photo gate electrode GP1 and the second photo gate electrode GP2 may be disposed adjacent to each other in the first direction DR1.

The first transfer gate electrode GT1 and the first floating diffusion node FD1 may be arranged in a direction facing away from the first direction DR1 so as to be spaced apart from the first photo gate electrode GP1. The first floating diffusion node FD1 may be formed at the source or drain of the first transfer transistor T1. The second transfer gate electrode GT2 and the second floating diffusion node FD2 may be arranged in the first direction DR1 so as to be spaced apart from the second photo gate electrode GP2. The second floating diffusion node FD2 may be formed at the source or drain of the second transfer transistor T2.

The overflow gate electrode GO may be disposed adjacent to the first and second photo gate electrodes GP1 and GP2 in the second direction DR2. The overflow transistor OF may be connected with a line for supplying the power supply voltage VDD. After the integration period, charges integrated by the first and second photo transistors P1 and P2 may be removed through the overflow transistor OF.

Although not illustrated, gates of the transistors R1, SF1, and SE1 included in the first read circuit RC1 may extend from the first floating diffusion node FD1 in at least one of the first direction DR1 and the second direction DR2, and gates of the transistors R2, SF2, and SE2 included in the second read circuit RC2 may extend from the second floating diffusion node FD2 in at least one of the first direction DR1 and the second direction DR2. That is, the layout of the first and second read circuits RC1 and RC2 may vary depending on embodiments, and additional description associated with the embodiments will be omitted to avoid redundancy.

Referring to FIGS. 1 and 2A to 2C, the first pixel PX1 may include a P-type substrate P-epi, a light detecting area LDA, first and second bridging diffusion areas BD1 and BD2, the first and second floating diffusion nodes FD1 and FD2, the first and second photo gate electrodes GP1 and GP2, and the first and second transfer gate electrodes GT1 and GT2. A third direction DR3 that is a direction in which light is received by the first pixel PX1 and is perpendicular to the first and second directions DR1 and DR2.

The light detecting area LDA, the first and second bridging diffusion areas BD1 and BD2, and the first and second floating diffusion nodes FD1 and FD2 may be formed in the P-type substrate P-epi. The P-type substrate P-epi may be an epitaxial substrate doped with P—, but the present disclosure is not limited thereto. Although not illustrated, a silicon oxide layer may be formed on the P-type substrate P-epi, and the first and second photo gate electrodes GP1 and GP2 and the first and second transfer gate electrodes GT1 and GT2 may be placed on the silicon oxide layer.

According to an embodiment, the P-type substrate P-epi may extend in the third direction DR3. To overcome low quantum efficiency (QM) due to an IR light source of a depth sensor used to measure a distance in the ToF manner, a length of the P-type substrate P-epi in the third direction DR3 may be greater than or equal to a reference value.

The light detecting area LDA may integrate charges depending on voltage levels of the first and second photo gate electrodes GP1 and GP2. The charges integrated in the light detecting area LDA may be transferred to the first and second bridging diffusion areas BD1 and BD2 and the first and second floating diffusion nodes FD1 and FD2. The light detecting area LDA may be an area doped with P-type impurities, but the present disclosure is not limited thereto.

For example, when the first photo gate signal PG1 of the high level is applied to the first photo gate electrode GP1, charges may be collected in the light detecting area LDA adjacent to the first photo gate electrode GP1. However, when the negative voltage VSSN is applied to the P-type substrate P-epi, even when the first photo gate signal PG1 of the low level is applied to the first photo gate electrode GP1, charges may be collected in the light detecting area LDA adjacent to the first photo gate electrode GP1.

For example, when the second photo gate signal PG2 of the high level is applied to the second photo gate electrode GP2, charges may be collected (or accumulated) in the light detecting area LDA adjacent to the second photo gate electrode GP2. However, when the negative voltage VSSN is applied to the P-type substrate P-epi, even when the second photo gate signal PG2 of the low level is applied to the second photo gate electrode GP2, charges may be collected (or accumulated) in the light detecting area LDA adjacent to the second photo gate electrode GP2. This will be more fully described with reference to FIGS. 5A to 5C.

For example, when the first transfer gate signal TG1 of the high level is applied to the first transfer gate electrode GT1, the charges collected in the light detecting area LDA adjacent to the first photo gate electrode GP1 may be transferred and stored at the first floating diffusion node FD1 through the first bridging diffusion area BD1. When the first transfer gate signal TG1 of the high level is applied to the second transfer gate electrode GT2, the charges collected in the light detecting area LDA adjacent to the second photo gate electrode GP2 may be transferred and stored at the second floating diffusion node FD2 through the second bridging diffusion area BD2.

According to an embodiment, the first and second bridging diffusion areas BD1 and BD2 may not be formed. In this case, the charges integrated in the light detecting area LDA may be directly transferred to the first and second floating diffusion nodes FD1 and FD2 based on the first transfer gate signal TG1. The first and second bridging diffusion areas BD1 and BD2 and the first and second floating diffusion nodes FD1 and FD2 may be doped with N-type impurities, but the present disclosure is not limited thereto.

According to an embodiment, areas corresponding to the first and second photo gate electrodes GP1 and GP2 in the light detecting area LDA may be separated in the first direction DR1 by a channel stop area (not illustrated) so as to be placed under the first and second photo gate electrodes GP1 and GP2.

Figure 3:
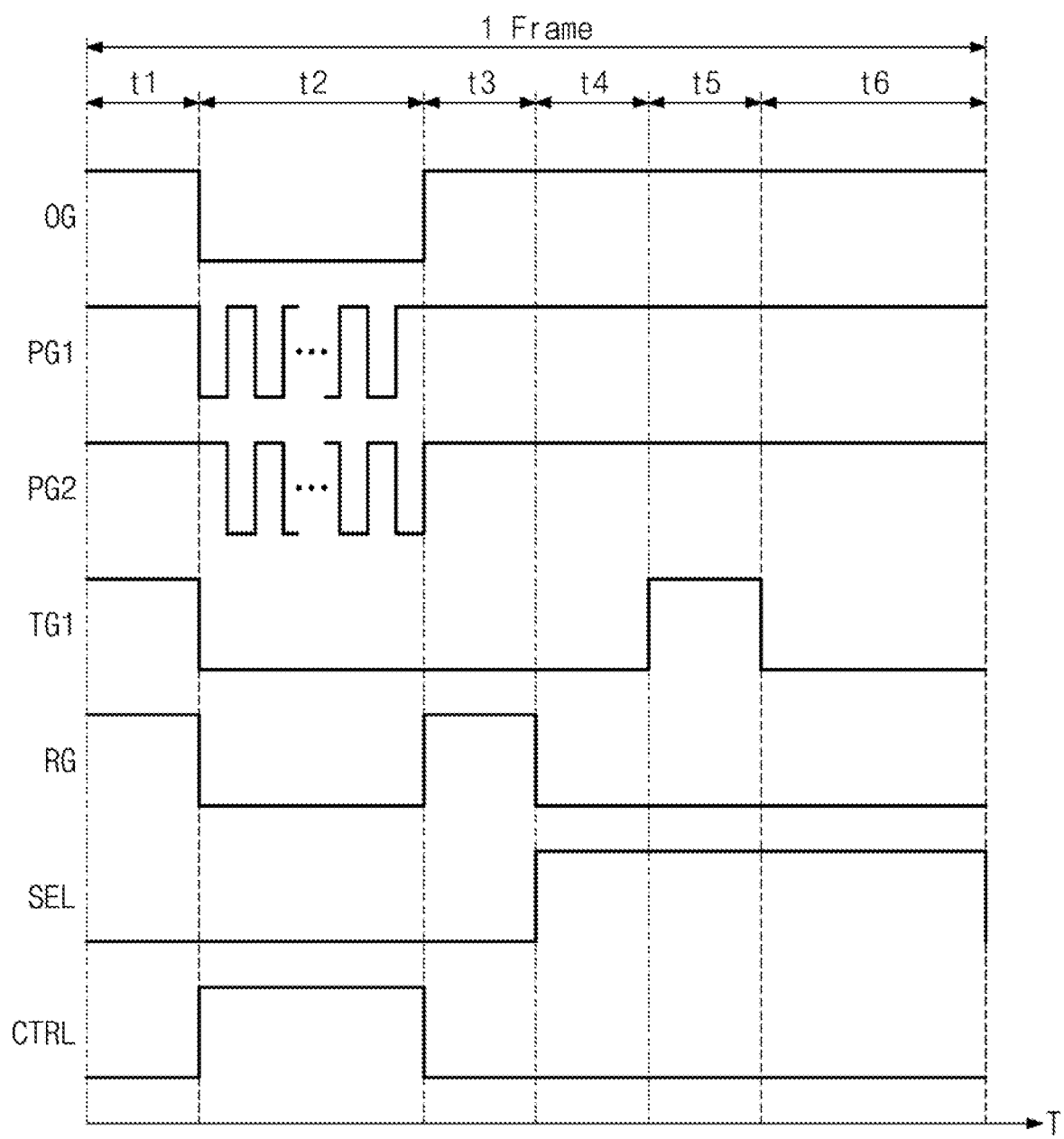
FIG. 3 is a timing diagram of the pixel of FIG. 2A.

FIG. 3 is a timing diagram of the pixel of FIG. 2A. Referring to FIGS. 1, 2A, and 3, a horizontal axis represents time, and a vertical axis represents magnitudes (or voltage levels) of the overflow gate signal OG, the first and second photo gate signals PG1 and PG2, the first transfer gate signal TG1, the reset gate signal RG, the selection signal SEL, and the switch control signal CTRL of FIG. 2A. The overflow gate signal OG, the first and second photo gate signals PG1 and PG2, the first transfer gate signal TG1, the reset gate signal RG, the selection signal SEL, and the switch control signal CTRL may be generated by the row driver 122 of FIG. 1.

A first time t1 may be a global reset time. During the global reset time, accumulated charges of the first and second floating diffusion nodes FD1 and FD2 and the charge integration circuit CC of the first pixel PX1 may be removed. During the global reset time, accumulated charges of pixels included in the pixel array 121 of FIG. 1 may be removed. To this end, the overflow gate signal OG, the reset gate signal RG, the first transfer gate signal TG1, and the first and second photo gate signals PG1 and PG2 may all have the high level. According to an embodiment, the first and second photo gate signals PG1 and PG2 may have the low level. The switch control signal CTRL may have the low level during the first time t1, but the present disclosure is not limited thereto.

A second time t2 may be the integration period or a sensing time. During the integration period, the light source 112 of FIG. 1 may output an emission light to the outside, and the first pixel PX1 may sense the emission light reflected by an object to integrate charges. The emission light may be output to the outside based on a first clock signal. The first clock signal may be identical to the first photo gate signal PG1. However, the present disclosure is not limited thereto. For example, the first clock signal may be identical to the second photo gate signal PG2. The first photo gate signal PG1 and the second photo gate signal PG2 may be complementary and may toggle.

The switch control signal CTRL may be maintained at the high level during the second time t2. Accordingly, the negative voltage VSSN may be applied to the node between the first and second photo transistors P1 and P2 and/or the node between the first and second transfer transistors T1 and T2. When the negative voltage VSSN is applied to the node, a toggle voltage difference may decrease. This will be more fully described with reference to FIGS. 5A to 5D.

During the high level of the first photo gate signal PGT, first charges may be integrated by the first photo transistor P1. For example, the first charges may be collected (or accumulated) in the light detecting area LDA adjacent to the first photo gate electrode GP1. According to an embodiment, when the negative voltage VSSN is applied to the node, even during the low level of the first photo gate signal PGT, the first charges may be integrated by the first photo transistor P1.

During the high level of the second photo gate signal PG2, second charges may be integrated by the second photo transistor P2. For example, the second charges may be collected (or accumulated) in the light detecting area LDA adjacent to the second photo gate electrode GP2. According to an embodiment, when the negative voltage VSSN is applied to the node, even during the low level of the second photo gate signal PG2, the second charges may be integrated by the second photo transistor P2.

The first transfer gate signal TG1 may be at the low level during the second time t2, and thus, the first and second transfer transistors T1 and T2 may be turned off. Accordingly, the charges collected in the light detecting area LDA may not be transferred to the first and second floating diffusion nodes FD1 and FD2.

A third time t3 may be a row reset time. During the row reset time, accumulated charges at the first and second floating diffusion nodes FD1 and FD2 and the charge integration circuit CC of the first pixel PX1 may be removed. During the row reset time, accumulated charges of pixels included in a row selected by the row driver 122 of FIG. 1 may be removed. To this end, the overflow gate signal OG and the reset gate signal RG may have the high level.

A fourth time t4 may be a reset signal read time. During the reset signal read time, a reset signal generated for resetting the first and second floating diffusion nodes FD1 and FD2 may be read. To this end, the selection signal SEL may have the high level, and the reset signal generated by the first and second source follower transistors SF1 and SF2 may be output to a bit line. The analog processing circuit 123 of FIG. 1 may compare the reset signal with an image signal to be read later.

A fifth time t5 may be a transfer time. During the transfer time, the first transfer gate signal TG1 may be at the high level. The first charges integrated by the first photo transistor P1 may be transferred to the first floating diffusion node FD1. The second charges integrated by the second photo transistor P2 may be transferred to the second floating diffusion node FD2.

A sixth time t6 may be an image signal read time. During the image signal read time, an image signal generated by the charges transferred to the first and second floating diffusion nodes FD1 and FD2 may be read. To this end, the selection signal SEL may have the high level, and the image signal generated by the first and second source follower transistors SF1 and SF2 may be output to the bit line.

After the sixth time t6, the operation described with reference to the third time t3, that is, the row reset time may be performed. In this case, accumulated charges of the first and second floating diffusion nodes FD1 and FD2 may be removed or discharged. Afterwards, the operation described with reference to the fourth time t4, that is, the reset signal read time may be performed, and the operation described with reference to the fifth time t5, that is, the transfer time may be performed. The operations described with reference to the third to sixth times t3 to t6 may be repeated depending on the number of times of a transfer of first and second charges.

Figure 4A:
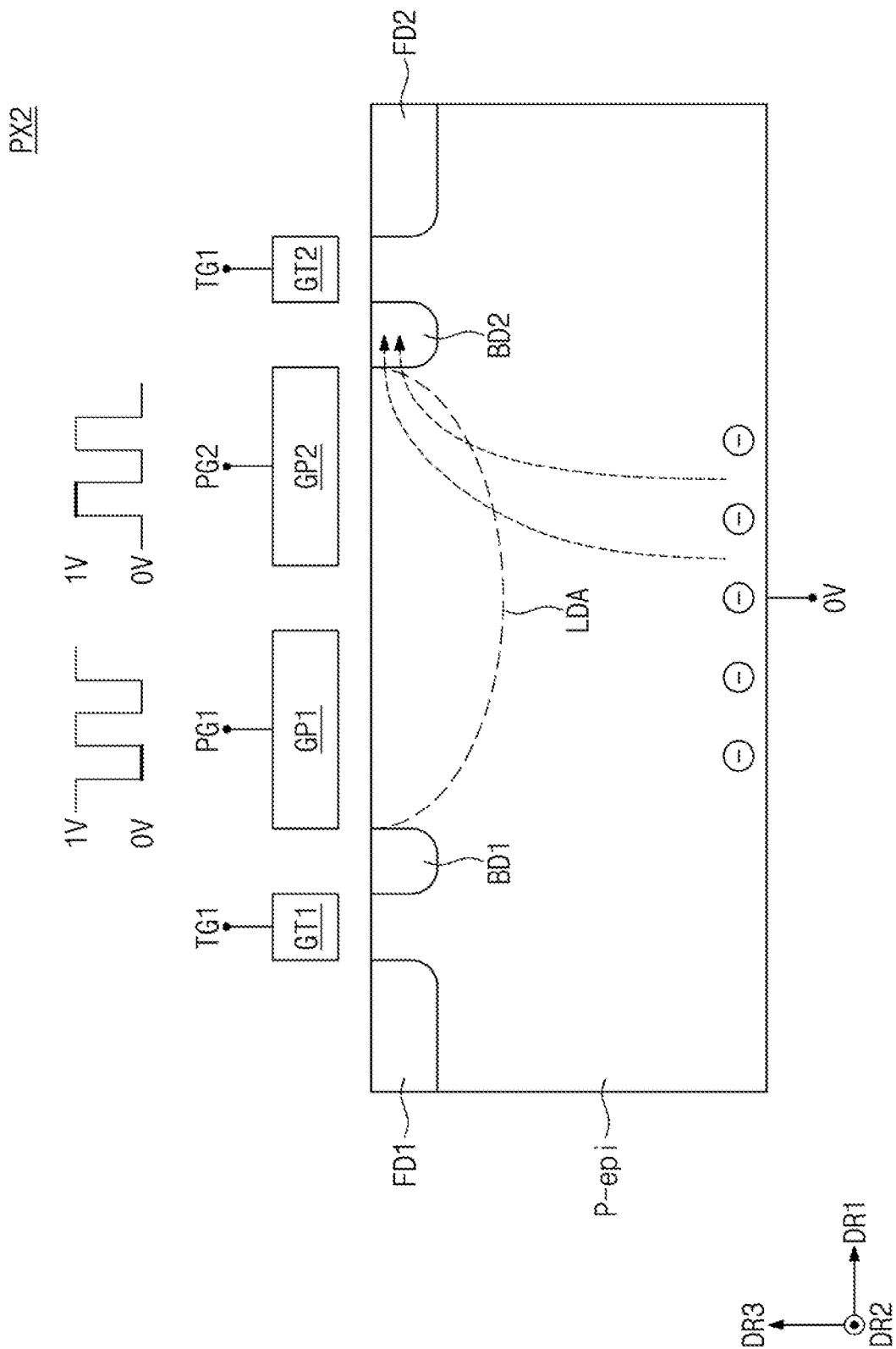
FIGS. 4A and 4B are views illustrating an example of an integration operation of a pixel according to an embodiment.
Figure 4B:
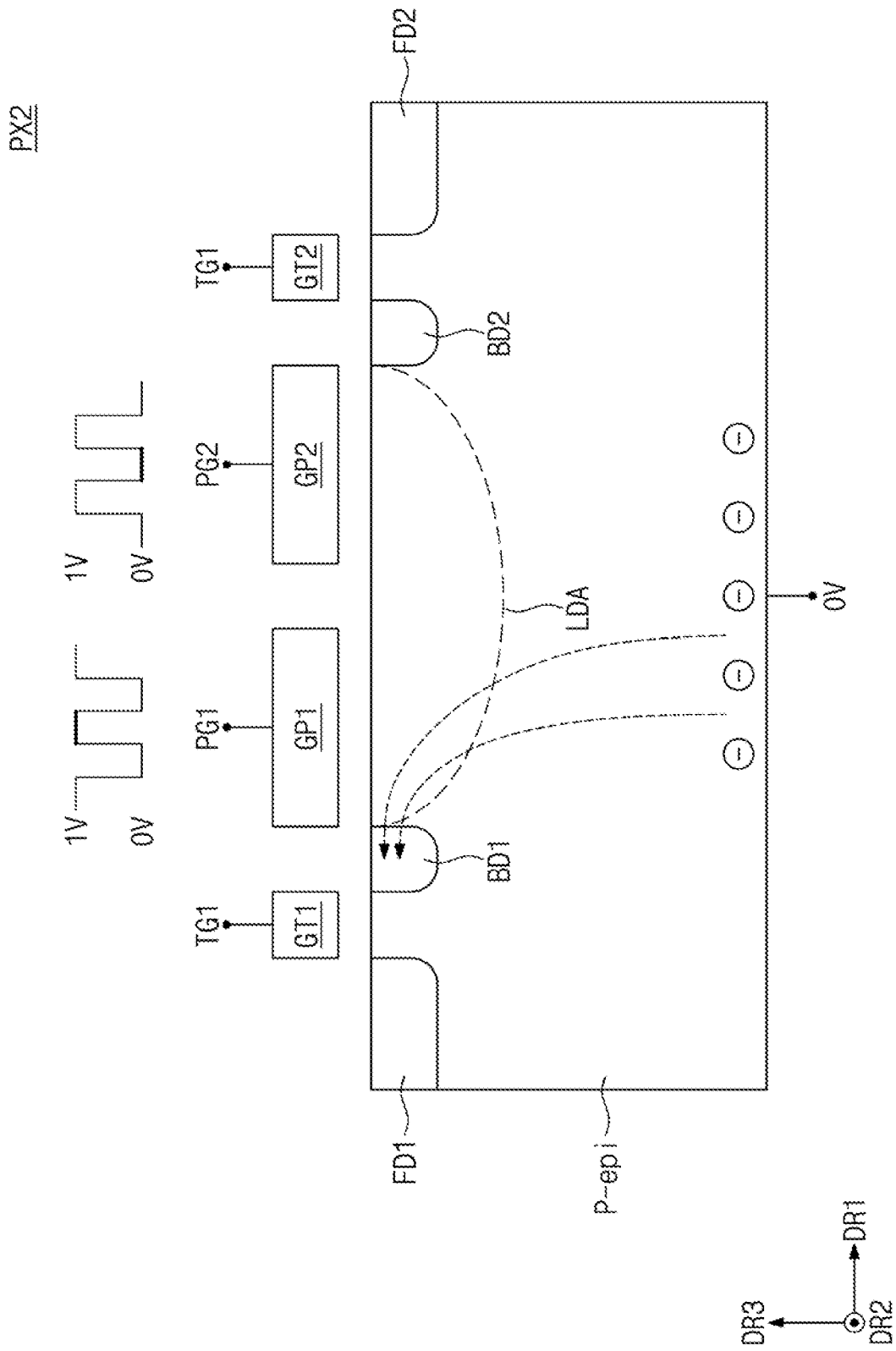

FIGS. 4A and 4B are views illustrating an example of an integration operation of a pixel according to an embodiment. Referring to FIGS. 1, 2A, 2C, 4A, and 4B, a second pixel PX2 may include the P-type substrate P-epi, the light detecting area LDA, the first and second bridging diffusion areas BD1 and BD2, the first and second floating diffusion nodes FD1 and FD2, the first and second photo gate electrodes GP1 and GP2, and the first and second transfer gate electrodes GT1 and GT2. The third direction DR3 that is a direction in which light is received and is perpendicular to the first and second directions DR1 and DR2. The components of FIG. 4A are similar to the components of FIG. 2C, and thus, additional description will be omitted to avoid redundancy.

A voltage of 0 V may be applied to the P-type substrate P-epi of the second pixel PX2. For example, when the switch control signal CTRL is at the low level, the node between the first and second photo transistors P1 and P2 and the node between the first and second transfer transistors T1 and T2 may be connected with the ground terminal, and the voltage of 0 V may be applied thereto.

The second pixel PX2 may receive the first and second photo gate signals PG1 and PG2 from the row driver 122 during the integration period. The first and second photo gate signals PG1 and PG2 may be signals that toggle between a first level and a second level such that toggle voltages of different phases are provided. For example, the first level may be 0 V, and the second level may be 1 V. That is, a toggle voltage difference may be 1 V. The row driver 122 may integrate charges based on the first and second photo gate signals PG1 and PG2.

Referring to FIG. 4A, when the first photo gate signal PG1 has a voltage of 0 V, the second photo gate signal PG2 may have a voltage of 1 V. In this case, a voltage difference may occur between the second photo gate electrode GP2 and the P-type substrate P-epi, and thus, second charges may be integrated in the light detecting area LDA adjacent to the second photo gate electrode GP2. According to an embodiment, the second charges may be stored in the second bridging diffusion area BD2 through the light detecting area LDA.

Referring to FIG. 4B, when the first photo gate signal PG1 has a voltage of 1 V, the second photo gate signal PG2 may have a voltage of 0 V. In this case, a voltage difference may occur between the first photo gate electrode GP1 and the P-type substrate P-epi, and thus, first charges may be integrated in the light detecting area LDA adjacent to the first photo gate electrode GP1. According to an embodiment, the first charges may be stored in the first bridging diffusion area BD1 through the light detecting area LDA.

That is, when a potential of the P-type substrate P-epi of the second pixel PX2 is 0 V, a predetermined toggle voltage difference may be required to clearly separate and integrate the first charges or the second charges. However, when the first and second photo gate signals PG1 and PG2 toggle during the integration period, the power consumption of the row driver 122 may become great. The power consumption of the row driver 122 may be reduced by decreasing the area of the first and second photo gate electrodes GP1 and GP2 such that a capacitance decreases or a toggle voltage difference decreases, but a demodulation contrast (DC) characteristic may be degraded. Also, as described with reference to FIG. 2C, in the case where the P-type substrate P-epi extends in the third direction DR3, a toggle voltage of a given level or higher may be required in collecting charges.

Figure 5A:
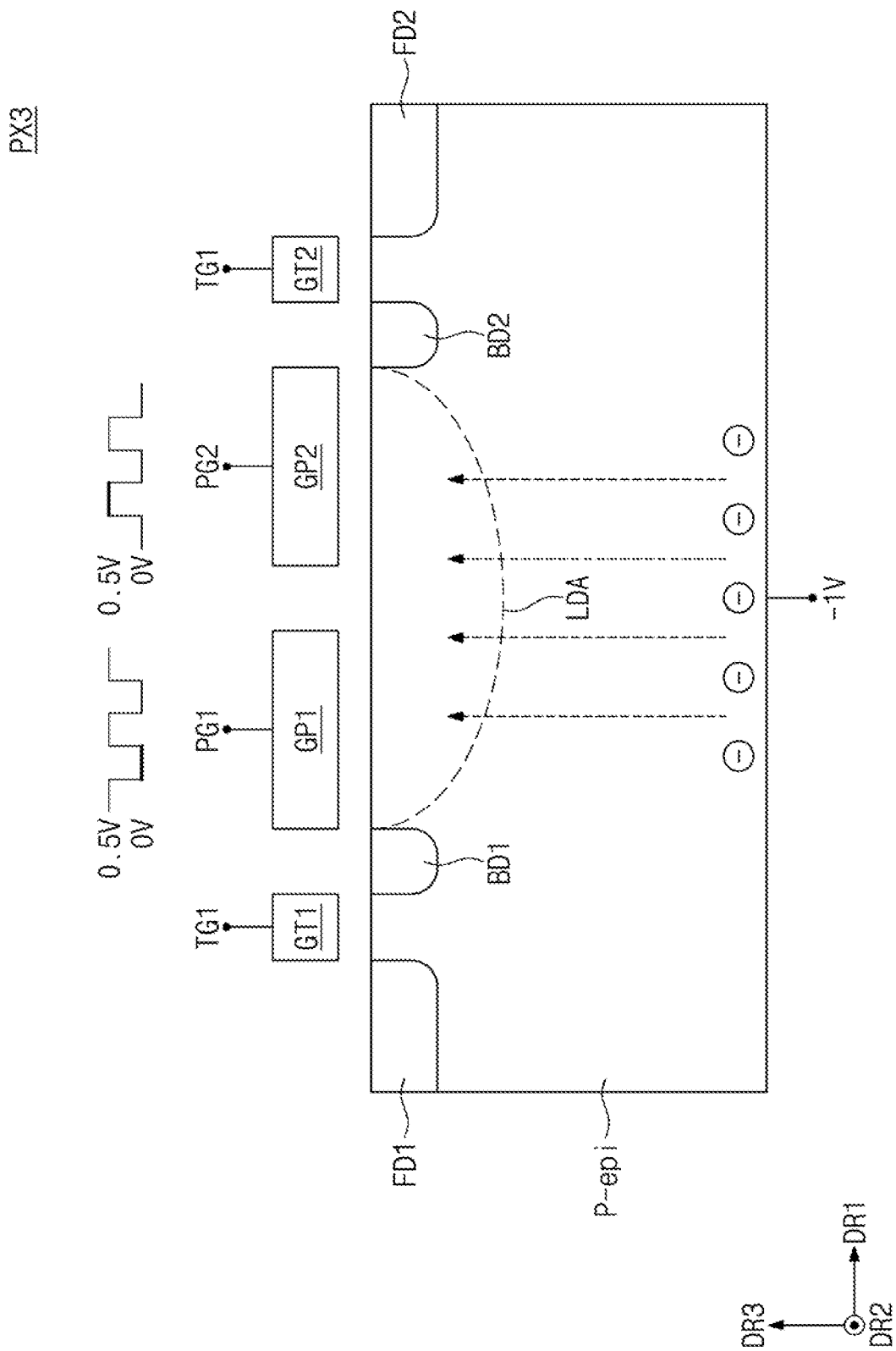
FIGS. 5A to 5D are views illustrating an example of operations of a pixel according to an embodiment.
Figure 5B:
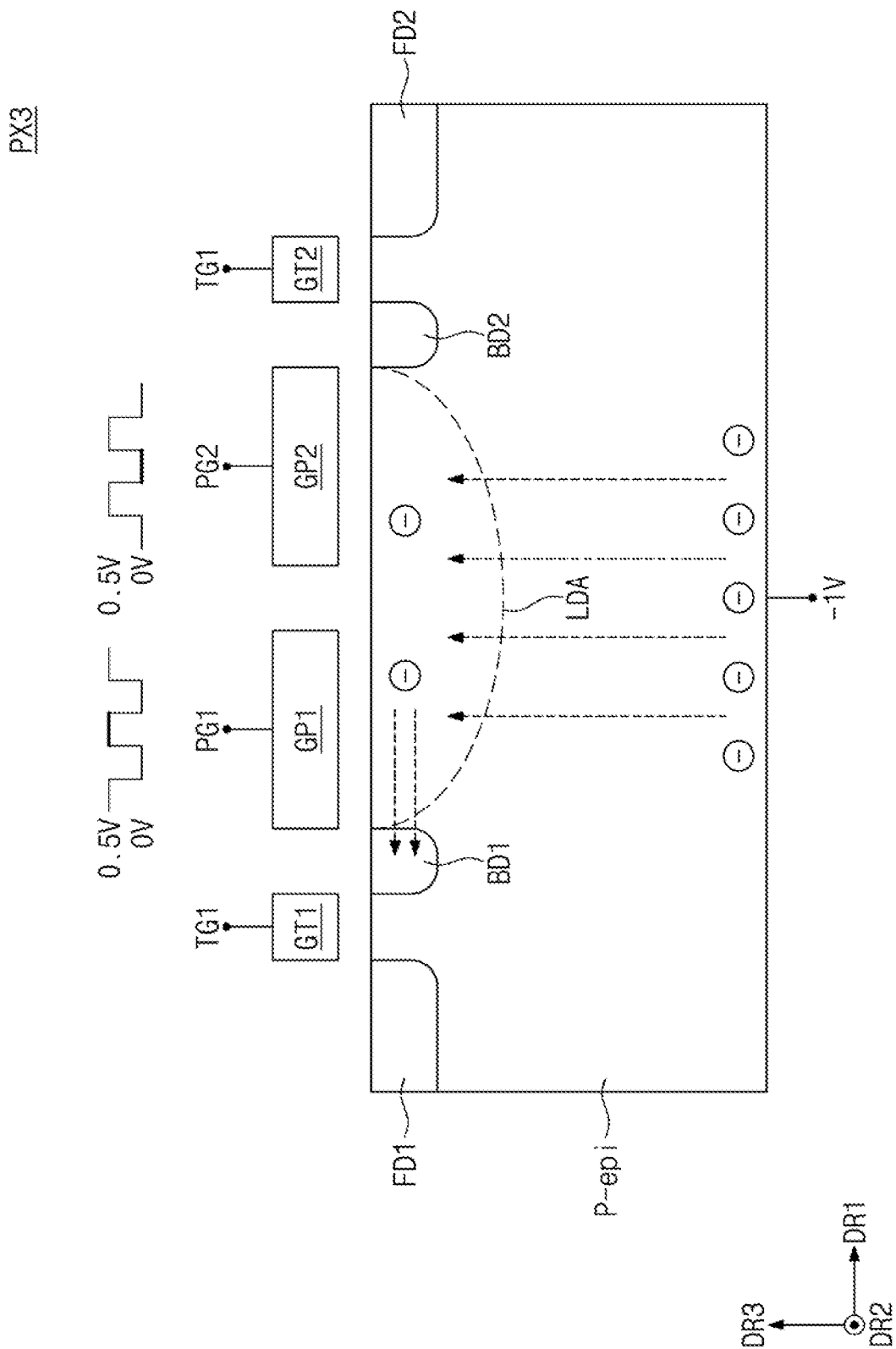
Figure 5C:
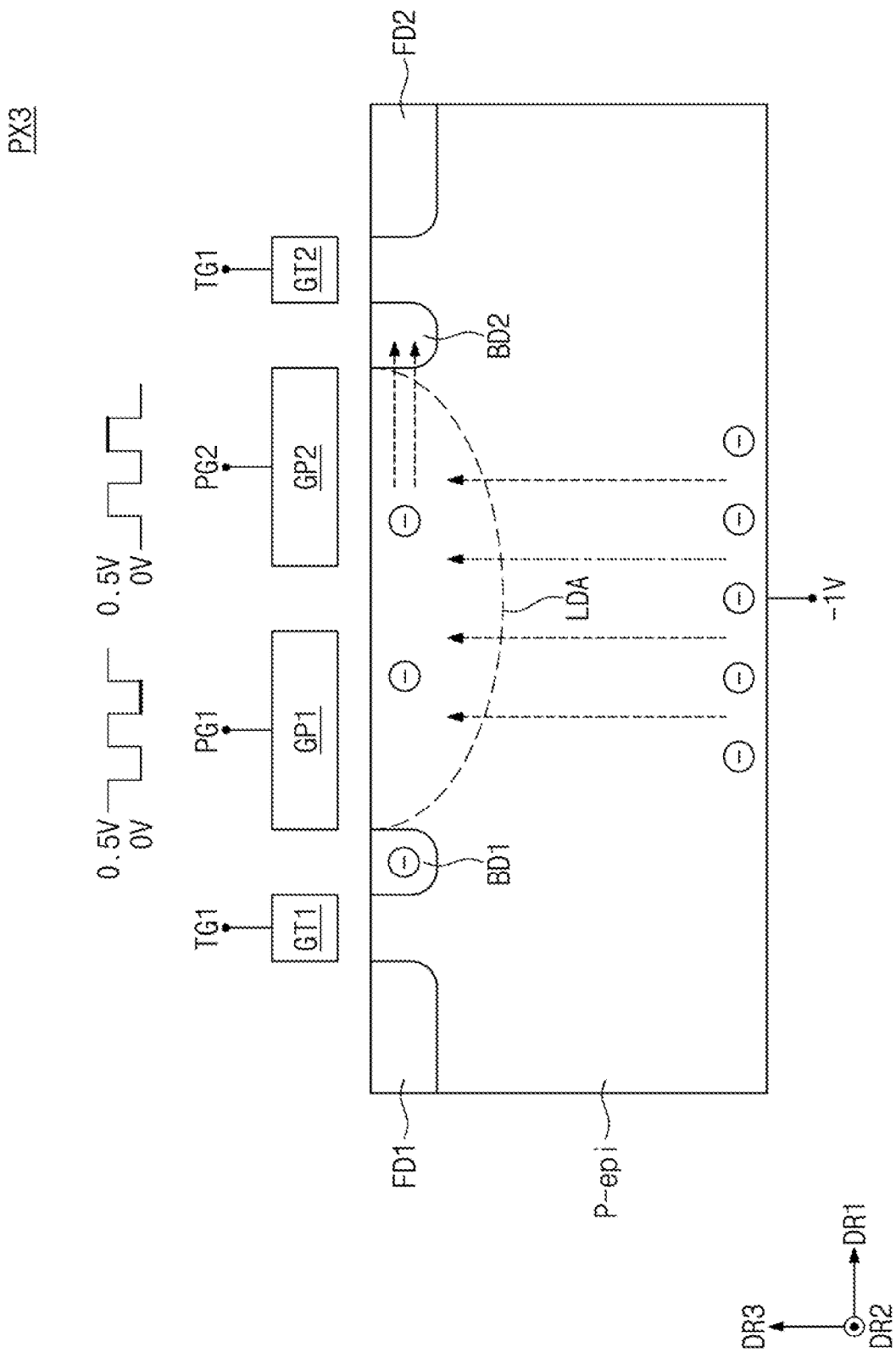
Figure 5D:
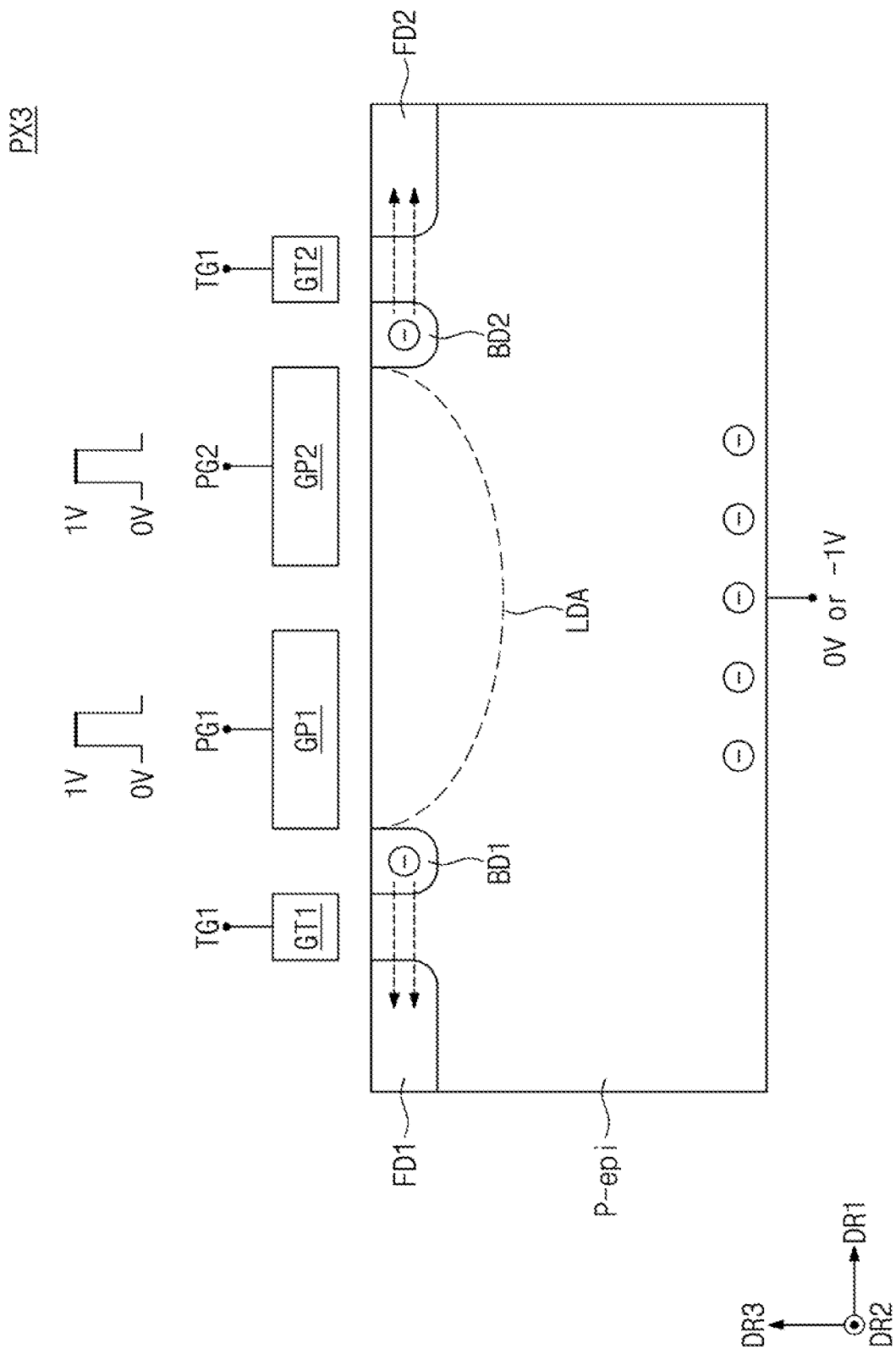

FIGS. 5A to 5D are views illustrating an example of operations of a pixel according to an embodiment of the present disclosure. FIGS. 5A to 5C show an integration operation and a store operation of a third pixels PX3, and FIG. 5D shows a transfer operation of the third pixels PX3.

Referring to FIGS. 1, 2A, 2C, and 5A to 5D, the third pixel PX3 may include the P-type substrate P-epi, the light detecting area LDA, the first and second bridging diffusion areas BD1 and BD2, the first and second floating diffusion nodes FD1 and FD2, the first and second photo gate electrodes GP1 and GP2, and the first and second transfer gate electrodes GT1 and GT2. The third direction DR3 that is a direction in which light is received may be perpendicular to the first and second directions DR1 and DR2. The components of FIGS. 5A to 5D are similar to the components of FIG. 2C, and thus, additional description will be omitted to avoid redundancy.

The negative voltage VSSN may be applied to the P-type substrate P-epi of the third pixel PX3. For example, when the switch control signal CTRL is at the high level, the node between the first and second photo transistors P1 and P2 and the node between the first and second transfer transistors T1 and T2 may be connected with the supply terminal of the negative voltage VSSN, and a voltage of −1 V may be applied thereto.

The third pixel PX3 may receive the first and second photo gate signals PG1 and PG2 from the row driver 122 during the integration period. The first and second photo gate signals PG1 and PG2 may be signals that toggle between a first level and a second level such that toggle voltages of different phases are provided. For example, the first level may be 0 V, and the second level may be 0.5 V. That is, a toggle voltage difference may be 0.5 V and may be smaller than a toggle voltage difference of FIG. 4A. The row driver 122 may integrate charges based on the first and second photo gate signals PG1 and PG2.

Referring to FIG. 5A, when the first photo gate signal PG1 has a voltage of 0 V, the second photo gate signal PG2 may have a voltage of 0.5 V. Accordingly, a voltage difference may be present between the first photo gate electrode GP1 and the P-type substrate P-epi and between the second photo gate electrode GP2 and the P-type substrate P-epi. In this case, first charges may be integrated in the light detecting area LDA adjacent to the first photo gate electrode GP1, and second charges may be integrated in the light detecting area LDA adjacent to the second photo gate electrode GP2. According to an embodiment, the first charges may be stored in the first bridging diffusion area BD1 through the light detecting area LDA. According to an embodiment, the second charges may be stored in the second bridging diffusion area BD2 through the light detecting area LDA.

Referring to FIG. 5B, when the first photo gate signal PG1 has a voltage of 0.5 V, the second photo gate signal PG2 may have a voltage of 0 V. Accordingly, a voltage difference may be present between the first photo gate electrode GP1 and the P-type substrate P-epi and between the second photo gate electrode GP2 and the P-type substrate P-epi. The first charges integrated in the light detecting area LDA of FIG. 5A may be stored in the first bridging diffusion area BD1 in response to the first photo gate signal PG1.

Referring to FIG. 5C, when the first photo gate signal PG1 has a voltage of 0 V, the second photo gate signal PG2 may have a voltage of 0.5 V. Accordingly, a voltage difference may be present between the first photo gate electrode GP1 and the P-type substrate P-epi and between the second photo gate electrode GP2 and the P-type substrate P-epi. The second charges integrated in the light detecting area LDA of FIG. 5A may be stored in the second bridging diffusion area BD2 in response to the second photo gate signal PG2.

Referring to FIG. 5D, when the first transfer gate signal TG1 is at the high level, the first and second transfer transistors T1 and T2 may be turned on. The high level of the first transfer gate signal TG1 may be greater than the high level of the first and second photo gate signals PG1 and PG2. For example, the high level of the first transfer gate signal TG1 may be 1 V. Accordingly, the first charges stored in the first bridging diffusion area BD1 may be transferred to the first floating diffusion node FD1, and the second charges stored in the second bridging diffusion area BD2 may be transferred to the second floating diffusion node FD2. During the transfer operation of FIG. 5D, the P-type substrate P-epi may be set to a ground state or may maintain a negative voltage state.

As described above, when the negative voltage VSSN is applied to the P-type substrate P-epi, even though the first photo gate signal PG1 or the second photo gate signal PG2 is at the low level (e.g., has a voltage of 0 V), a voltage difference may be present in the P-type substrate P-epi. Accordingly, charges generated by the sensed light may move in the third direction DR3 so as to be integrated in the light detecting area LDA. Also, when the first photo gate signal PGT or the second photo gate signal PG2 is at the high level (e.g., has a voltage of 0.5 V), charges integrated in the light detecting area LDA may move in the first direction DR1 so as to be stored in the first bridging diffusion area BD1 or the second bridging diffusion area BD2. In other words, when the negative voltage VSSN is applied to the body of the third pixels PX3, a toggle voltage difference for the integration operation or the store operation may be smaller than that of FIG. 4A. Accordingly, the third pixels PX3 may reduce the power consumption of the row driver 122 while preventing the DC characteristic from being degraded.

Figure 6:
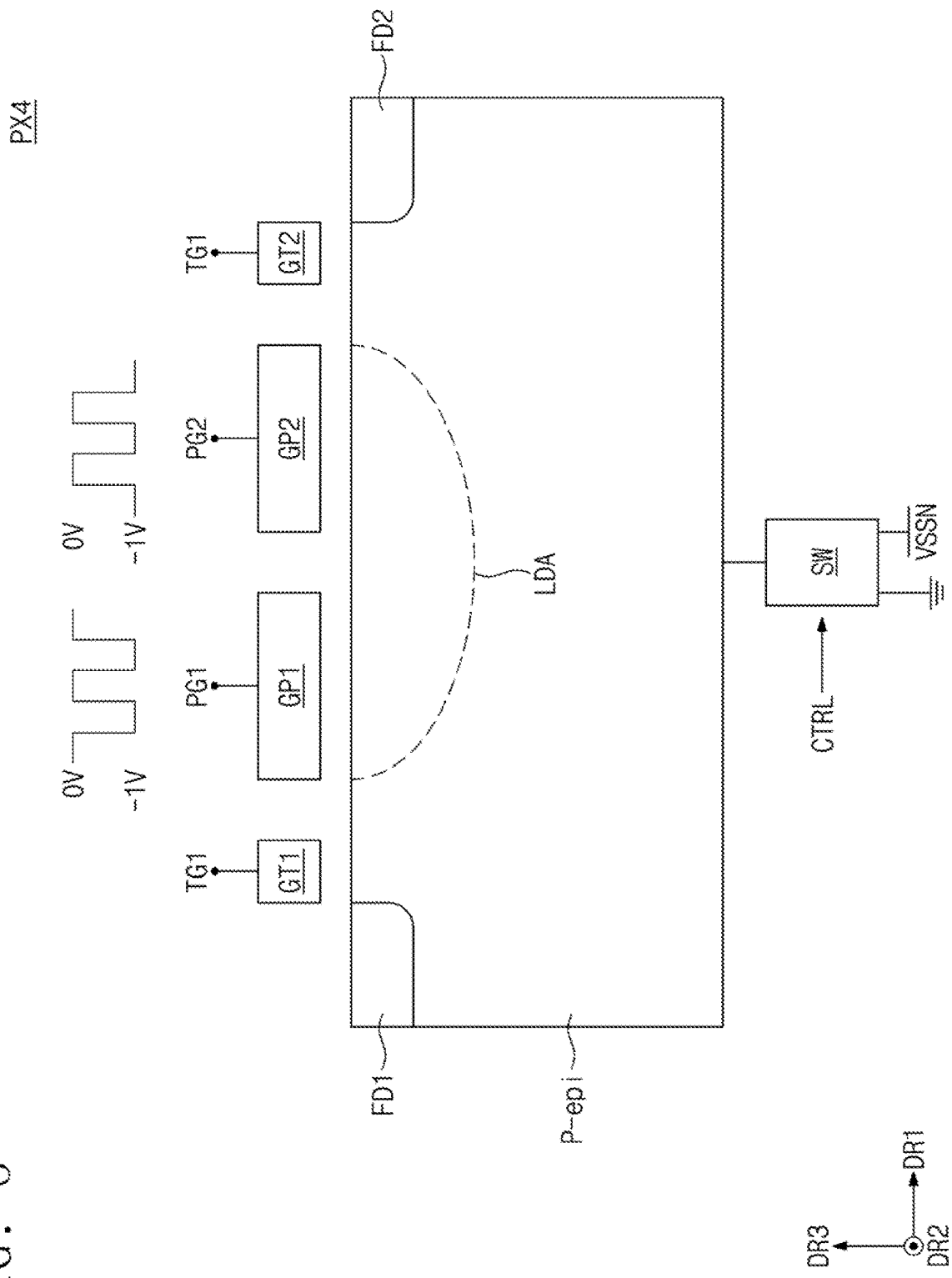
FIG. 6 is a view illustrating an example of a pixel according to an embodiment.
Figure 7:
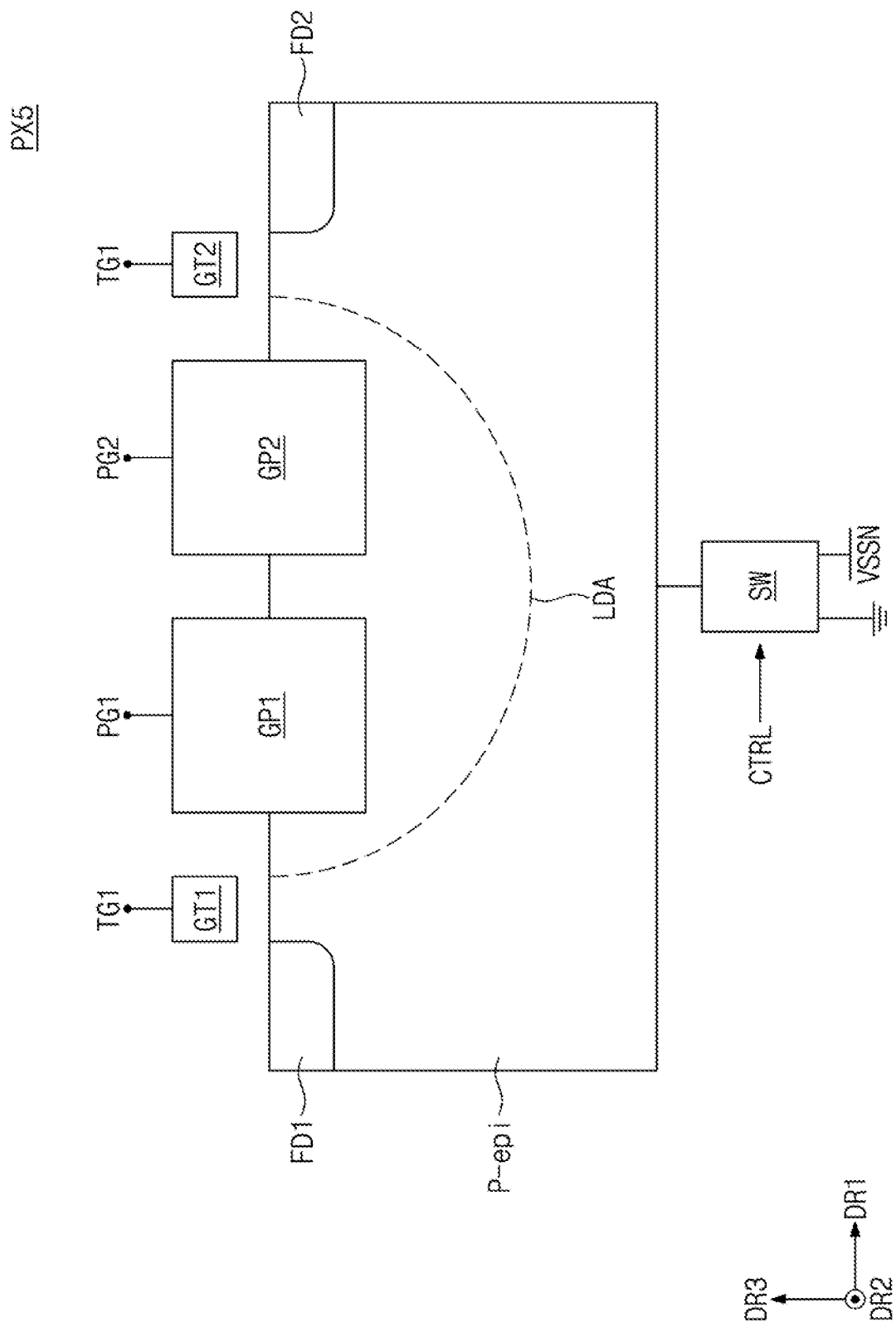
FIG. 7 is a view illustrating an example of a pixel according to an embodiment.
Figure 8:
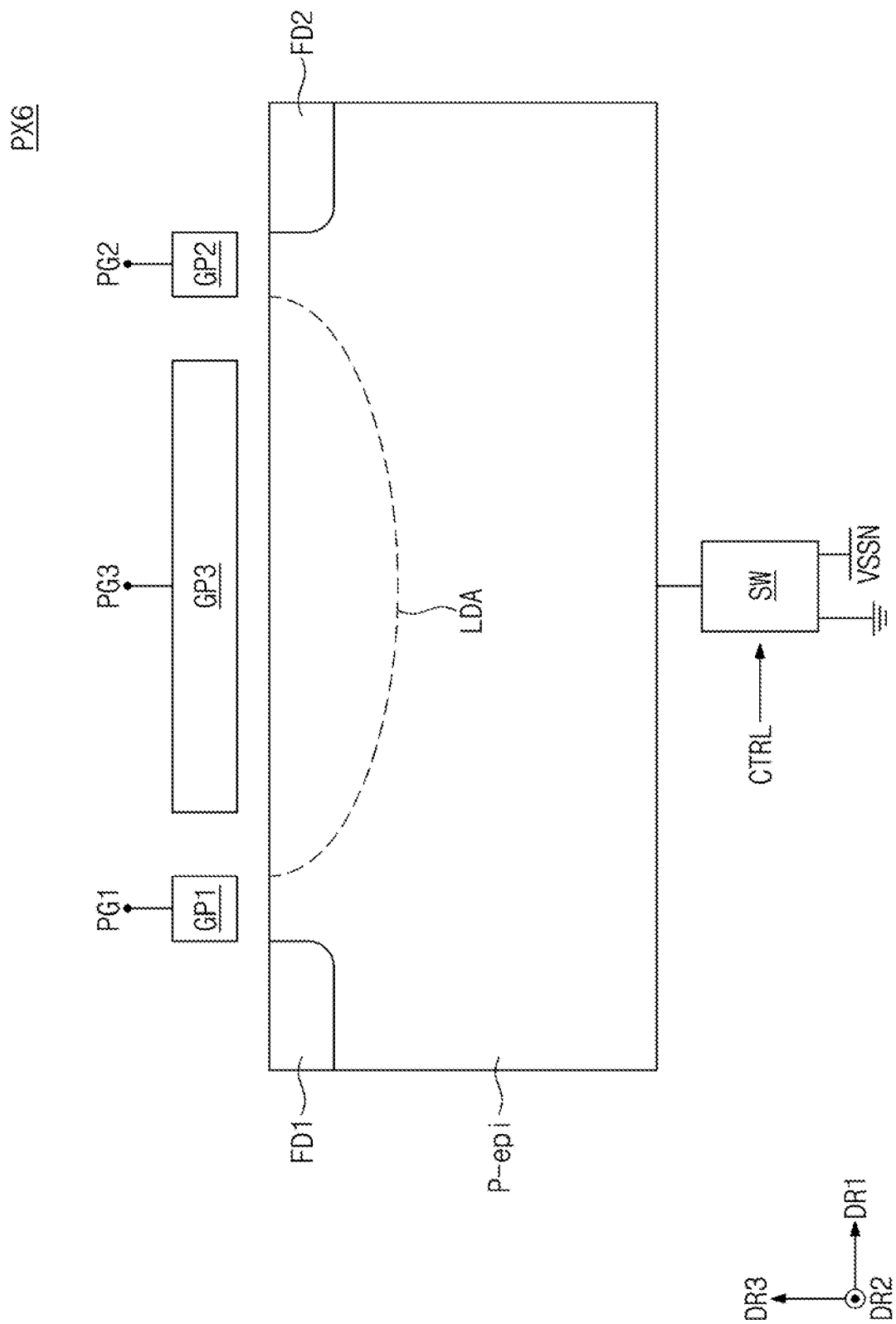
FIG. 8 is a view illustrating an example of a pixel according to an embodiment.
Figure 9:
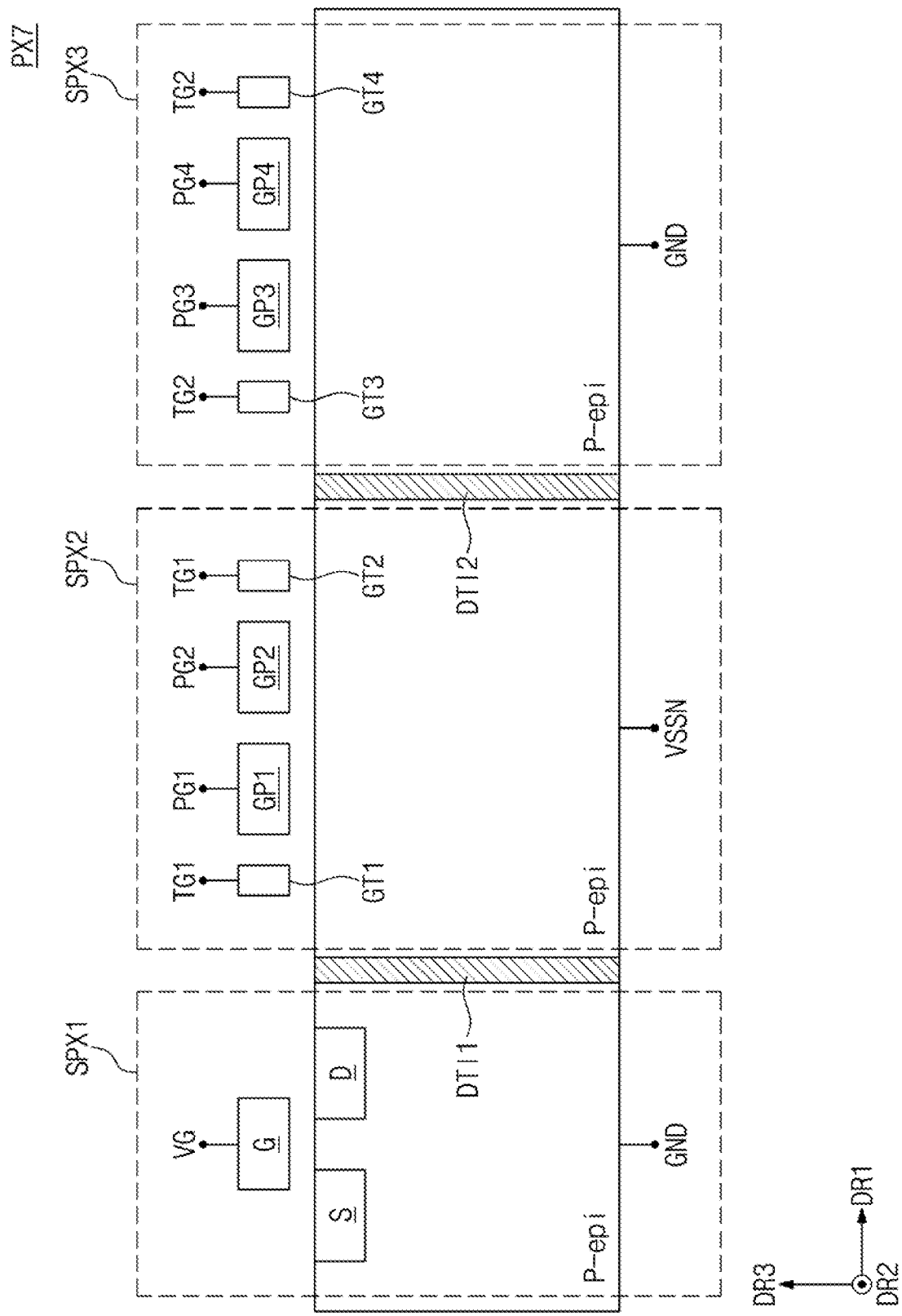
FIG. 9 is a view illustrating an example of a pixel according to an embodiment.

FIGS. 6 to 9 are views illustrating an example of the pixel of FIG. 1. FIG. 6 is a cross-sectional view of a fourth pixel PX4, FIG. 7 is a cross-sectional view of a fifth pixel PX5, FIG. 8 is a cross-sectional view of a sixth pixel PX6, and FIG. 9 is a cross-sectional view of a seventh pixel PX7. Components of each of the fourth to seventh pixels PX4, PX5, PX6, and PX7 are similar to the components of the first pixel PX1 of FIG. 2C, and thus, additional description will be omitted to avoid redundancy. Below, a difference between the fourth to seventh pixels PX4, PX5, PX6, and PX7 and the first pixel PXT of FIG. 2C will be mainly described.

Referring to FIG. 6, the fourth pixel PX4 may include the P-type substrate P-epi, the first and second photo gate electrodes GP1 and GP2, and the first and second transfer gate electrodes GT1 and GT2. The light detecting area LDA, the first floating diffusion node FD1, and the second floating diffusion node FD2 may be formed in the P-type substrate P-epi. Although not shown, the first and second bridging diffusion areas BD1 and BD2 may be included in the light detecting area LDA.

The P-type substrate P-epi may include an upper surface and a lower surface, and the first and second photo gate electrodes GP1 and GP2 and the first and second transfer gate electrodes GT1 and GT2 may be formed over the upper surface of the P-type substrate P-epi. The switch SW may be connected with the lower surface of the P-type substrate P-epi. The switch SW may control a voltage to be applied to the P-type substrate P-epi based on the switch control signal CTRL. For example, during the integration period, the switch SW may apply the negative voltage VSSN to the P-type substrate P-epi in response to the switch control signal CTRL of the high level. For example, during the remaining period other than the integration period, the switch SW may apply the negative voltage VSSN or the ground voltage to the P-type substrate P-epi in response to the switch control signal CTRL of the low level.

The first photo gate electrode GP1 may receive the first photo gate signal PGT, and the second photo gate electrode GP2 may receive the second photo gate signal PG2. A phase of the first photo gate signal PGT may be opposite to a phase of the second photo gate signal PG2. Each of the first and second photo gate signals PGT and PG2 may include a signal toggling between the high level and the low level during the integration period. According to an embodiment, the low level may be less than 0 V. For example, the low level may have the same potential as the negative voltage VSSN (e.g., −1 V).

Referring to FIG. 7, the fifth pixel PX5 may include the P-type substrate P-epi, the first and second photo gate electrodes GP1 and GP2, and the first and second transfer gate electrodes GT1 and GT2. The switch SW may be connected with the lower surface of the P-type substrate P-epi. The P-type substrate P-epi and the switch SW of FIG. 7 are similar to the P-type substrate P-epi and the switch SW of FIG. 6, and thus, additional description will be omitted to avoid redundancy.

The first photo gate electrode GP1 and the second photo gate electrode GP2 may extend in a direction perpendicular to the upper surface of the P-type substrate P-epi (or a direction facing away from the third direction DR3). That is, the first and second photo gate electrodes GP1 and GP2 may be vertical photo gate electrodes. Accordingly, portions of the first and second photo gate electrodes GP1 and GP2 may be formed within the P-type substrate P-epi. As such, the light detecting area LDA may be expanded in the direction facing away from the third direction DR3. That is, the light detecting area LDA may be formed to have a larger area in the P-type substrate P-epi compared to the fourth pixel PX4 shown in FIG. 6.

Referring to FIG. 8, the sixth pixel PX6 may include the P-type substrate P-epi and first to third photo gate electrodes GP1, GP2, and GP3. The switch SW may be connected with the lower surface of the P-type substrate P-epi. The P-type substrate P-epi and the switch SW of FIG. 8 are similar to the P-type substrate P-epi and the switch SW of FIG. 6, and thus, additional description will be omitted to avoid redundancy.

The third photo gate electrode GP3 may be interposed between the first photo gate electrode GP1 and the second photo gate electrode GP2. That is, a third photo transistor corresponding to the third photo gate electrode GP3 may be connected in series between the first photo transistor P1 and the second photo transistor P2. A length of the third photo gate electrode GP3 in the first direction DR1 may be longer than lengths of the first and second photo gate electrodes GP1 and GP2 in the first direction DR1. That is, a capacitance of the third photo gate electrode GP3 may be greater than a capacitance of each of the first photo gate electrode GP1 and the second photo gate electrode GP2.

The third photo gate electrode GP3 may receive a third photo gate signal PG3. During the integration period, the third photo gate signal PG3 may not toggle and may maintain a voltage level of 0 V or higher. For example, when the voltage level is 1 V and the negative voltage VSSN is applied to the P-type substrate P-epi through the switch SW, charges may be integrated in the light detecting area LDA.

The first and second photo gate signals PG1 and PG2 may toggle between the high level and the low level, and charges may be transferred to the first floating diffusion node FD1 and the second floating diffusion node FD2 in response to the first and second photo gate signals PG1 and PG2 of the high level. That is, the first and second photo gate electrodes GP1 and GP2 may function as the first and second transfer gate electrodes GT1 and GT2 of FIG. 2C except that the first and second photo gate electrodes GP1 and GP2 receive a toggle signal. Accordingly, the sixth pixel PX6 may be a toggling transfer gate structure.

Referring to FIG. 9, the seventh pixel PX7 may include first to third sub-pixels SPX1, SPX2, and SPX3. The first to third sub-pixels SPX1, SPX2, and SPX3 may be arranged in the first direction DR1. The first sub-pixel SPX1 may include a transistor including a gate "G", a source "S", and a drain "D", and the P-type substrate P-epi. A ground voltage GND may be applied to the P-type substrate P-epi of the first sub-pixel SPX1.

Each of the second and third sub-pixels SPX2 and SPX3 has a structure similar to that of the first pixel PX1 of FIG. 2C, and thus, additional description will be omitted to avoid redundancy. The second sub-pixel SPX2 may include the P-type substrate P-epi, the first and second photo gate electrodes GP1 and GP2, and the first and second transfer gate electrodes GT1 and GT2. The third sub-pixel SPX3 may include the P-type substrate P-epi, third and fourth photo gate electrodes GP3 and GP4, and third and fourth transfer gate electrodes GT3 and GT4.

According to an embodiment, the negative voltage VSSN may be applied to the P-type substrate P-epi of the second sub-pixel SPX2, and the ground voltage GND may be applied to the P-type substrate P-epi of the third sub-pixel SPX3.

An area of the second sub-pixel SPX2 may be formed by a first deep trench isolation DTI1 and a second deep trench isolation DTI2. That is, the second sub-pixel SPX2 may be formed in an area between the first deep trench isolation DTI1 and the second deep trench isolation DTI2. The first and second deep trench isolations DTI1 and DTI2 may prevent charges generated by the second sub-pixel SPX2 from being transferred to the first and third sub-pixels SPX1 and SPX3. The first and second deep trench isolations DTI1 and DTI2 may include oxide or polysilicon, but the present disclosure is not limited thereto.

The first and second deep trench isolations DTI1 and DTI2 may be formed at opposite ends of the P-type substrate P-epi of the second sub-pixel SPX2 (or to make contact with the opposite ends thereof). The first and second deep trench isolations DTI1 and DTI2 may extend in the third direction DR3. According to an embodiment, each of the first and second deep trench isolations DTI1 and DTI2 may mean a front deep trench isolation (0).

Figure 10:
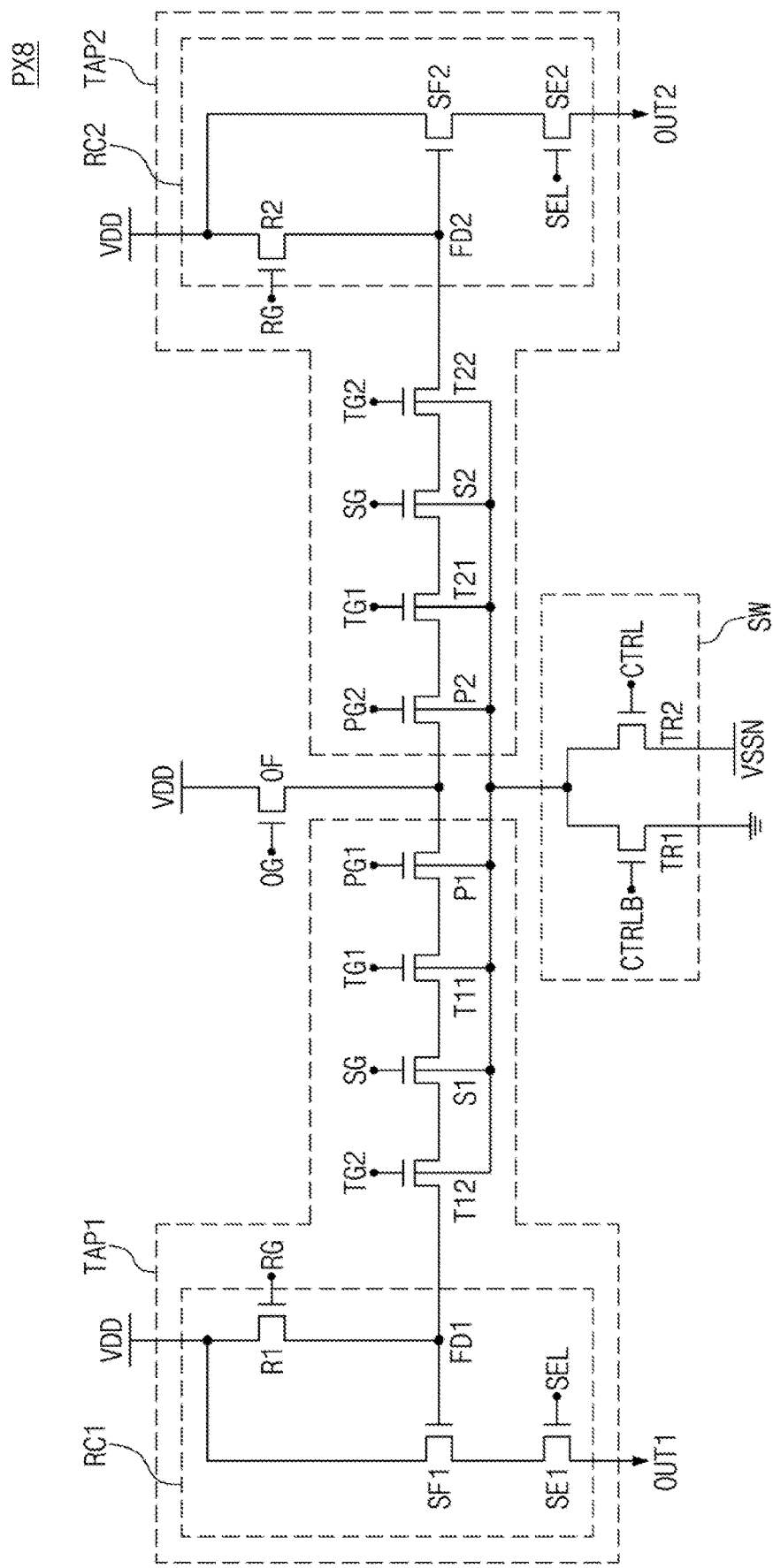
FIG. 10 is a circuit diagram illustrating an example of a pixel according to an embodiment.

FIG. 10 is a circuit diagram illustrating an example of the pixel of FIG. 1. Referring to FIG. 10, an eighth pixel PX8 may include the first and second photo transistors P1 and P2, first to fourth transfer transistors T11, T21, T12, and T22, first and second storage transistors S1 and S2, the first and second read circuits RC1 and RC2, the overflow transistor OF, and the switch SW. The first and second photo transistors P1 and P2, the third and fourth transfer transistors T12 and T22, the first and second read circuits RC1 and RC2, the overflow transistor OF, and the switch SW are similar to the first and second photo transistors P1 and P2, the first and second transfer transistors T1 and T2, the first and second read circuits RC1 and RC2, the overflow transistor OF, and the switch SW, and thus, additional description will be omitted to avoid redundancy.

The first photo transistor P1 may integrate first charges based on the first photo gate signal PG1 toggling during the integration period. The second photo transistor P2 may integrate second charges based on the second photo gate signal PG2 toggling during the integration period. A phase of the second photo gate signal PG2 may be opposite to a phase of the first photo gate signal PG1.

The first and second storage transistors S1 and S2 may store charges integrated by the first and second photo transistors P1 and P2. In response to a storage gate signal SG, the first storage transistor S1 may store the first charges integrated by the first photo transistor P1 and may transfer the stored first charges to the first floating diffusion area FD1. In response to the storage gate signal SG, the second storage transistor S2 may store the second charges integrated by the second photo transistor P2 and may transfer the stored second charges to the second floating diffusion area FD2.

During the integration period, the first storage transistor S1 may store the first charges based on the storage gate signal SG of the high level. When the storage gate signal SG is at the high level, the first storage transistor S1 may have a maximum storage capacity for storing charges. The first storage transistor S1 may be connected in series between the first transfer transistor T11 and the third transfer transistor T12.

During the remaining period other than the integration period, the first storage transistor S1 may transfer the first charges to the first floating diffusion node FD1 based on the storage gate signal SG of the low level. When the storage gate signal SG is at the low level, the storage capacity of the first storage transistor S1 may decrease. The first charges may be transferred to the first floating diffusion node FD1 through the third transfer transistor T12 depending on the decreased storage capacity. For example, if the first charges accumulated at the first floating diffusion node FD1 is less than a predetermined storage capacity, the third transfer transistor T12 may not transfer the first charges at the first floating diffusion node FD1. Similarly, if the second charges accumulated at the second floating diffusion node FD2 is less than the predetermined storage capacity, the fourth transfer transistor T22 may not transfer the second charges at the second floating diffusion node FD2.

Like the first storage transistor S1, during the integration period, the second storage transistor S2 may store the second charges based on the storage gate signal SG of the high level. During the integration period, the second storage transistor S2 may transfer the second charges to the second floating diffusion node FD2 based on the storage gate signal SG of the low level. The second storage transistor S2 may be connected in series between the second transfer transistor T21 and the fourth transfer transistor T22.

The first to fourth transfer transistors T11, T21, T12, and T22 may control the transfer of charges integrated by the first and second photo transistors P1 and P2. The first and third transfer transistor T11 and T12 may control the transfer of the integrated first charges from the first photo transistor P1 to the first floating diffusion node FD1. The second and fourth transfer transistor T21 and T22 may control the transfer of the integrated second charges from the second photo transistor P2 to the second floating diffusion node FD2.

During the integration period, the first transfer transistor T11 may transfer the first charges from the first photo transistor P1 to the first storage transistor S1 based on the first transfer gate signal TG1 of the high level. During the transfer period, the first transfer transistor T11 may block the transfer of the first charges from the first storage transistor S1 to the first photo transistor P1 based on the first transfer gate signal TG1 of the low level. The first transfer transistor T11 may be connected in series between the first photo transistor P1 and the first storage transistor S1.

As in the first transfer transistor T11, the second transfer transistor T21 may control the transfer of the second charges from the second photo transistor P2 to the second storage transistor S2 based on the first transfer gate signal TG1. The second transfer transistor T21 may be connected in series between the second photo transistor P2 and the second storage transistor S2.

The third transfer transistor T12 may be connected in series between the first storage transistor S1 and the first floating diffusion node FD1. The third transfer transistor T12 may transfer the first charges stored in the first storage transistor S1 to the first floating diffusion node FD1 based on a second transfer gate signal TG2. The fourth transfer transistor T22 may be connected in series between the second storage transistor S2 and the second floating diffusion node FD2. The fourth transfer transistor T22 may transfer the second charges stored in the second storage transistor S2 to the second floating diffusion node FD2 based on the second transfer gate signal TG2. The third and fourth transfer transistors T12 and T22 are similar to the first and second transfer transistors T1 and T2 of FIG. 2A, and thus, additional description will be omitted to avoid redundancy.

The first read circuit RC1 generates the first image signal OUT1 based on the charges stored at the first floating diffusion node FD1. The first read circuit RC1 may include the first reset transistor R1, the first source follower transistor SF1, and the first select transistor SET. The second read circuit RC2 generates the second image signal OUT2 based on the charges stored at the second floating diffusion node FD2. The second read circuit RC2 may include the second reset transistor R2, the second source follower transistor SF2, and the second select transistor SE2.

A first tap TAP1 may include the first photo transistor P1, the first and third transfer transistors T11 and T12, the first storage transistor S1, and the first read circuit RC1. A second tap TAP2 may include the second photo transistor P2, the second and fourth transfer transistors T21 and T22, the second storage transistor S2, and the second read circuit RC2. A configuration and an operation of the first tap TAP1 may be substantially the same as those of the second tap TAP2 except that the first tap TAP1 and the second tap TAP2 respectively receive the first photo gate signal PG1 and the second photo gate signal PG2 having different phases. The first photo gate signal PG1 and the second photo gate signal PG2 may have a phase difference of 180 degrees.

The overflow transistor OF may be connected in parallel with the connection node of the first photo transistor P1 and the second photo transistor P2. The overflow transistor OF may be turned on during the remaining period other than the integration period such that the first charges integrated by the first photo transistor P1 and the second charges integrated by the second photo transistor P2 are removed.

The switch SW may be connected with a node between the first and second photo transistors P1 and P2, a node between the first to fourth transfer transistors T11, T21, T12, and T22, and a node between the first and second storage transistors S1 and S2. Here, the node between the first and second photo transistors P1 and P2, a node between the first to fourth transfer transistors T11, T21, T12 and T22, and the node between the first and second storage transistors S1 and S2 may be the same node. The switch SW may apply the ground voltage or the negative voltage VSSN to the node between the first and second photo transistors P1 and P2, the node between the first to fourth transfer transistors T11, T21, T12, and T22, and the node between the first and second storage transistors S1 and S2.

The switch SW may operate based on the switch control signal CTRL and the inverted switch control signal CTRLB. The switch SW may apply the negative voltage VSSN to the node between the first and second photo transistors P1 and P2, the node between the first to fourth transfer transistors T11, T21, T12, and T22, and the node between the first and second storage transistors S1 and S2 in response to the switch control signal CTRL of the high level. The switch SW may apply the ground voltage to the node between the first and second photo transistors P1 and P2, the node between the first to fourth transfer transistors T11, T12, T21, and T22, and the node between the first and second storage transistors S1 and S2 in response to the switch control signal CTRL of the low level. The switch control signal CTRL may maintain the high level during the integration period.

Figure 11:
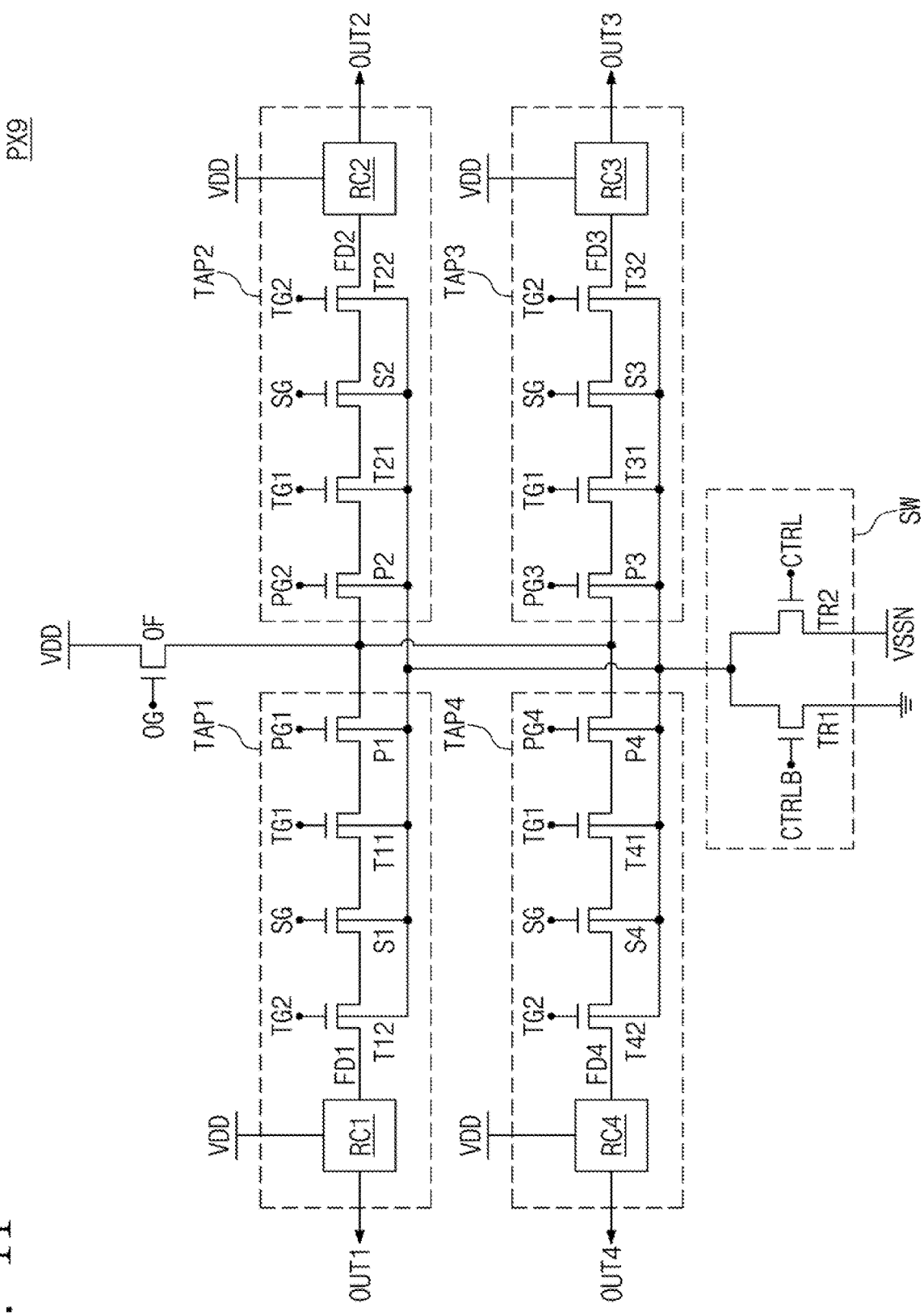
FIG. 11 is a circuit diagram illustrating an example of a pixel according to an embodiment.

FIG. 11 is a circuit diagram illustrating an example of the pixel of FIG. 1. Referring to FIG. 11, a ninth pixel PX9 may include first to fourth taps TAP1, TAP2, TAP3, and TAP4, the overflow transistor OF, and the switch SW.

The first tap TAP1 may include the first photo transistor P1, the first and third transfer transistors T11 and T12, the first storage transistor S1, and the first read circuit RC1. The second tap TAP2 may include the second photo transistor P2, the second and fourth transfer transistors T21 and T22, the second storage transistor S2, and the second read circuit RC2. The first tap TAP1 and the second tap TAP2 are similar to the first tap TAP1 and the second tap TAP2 of FIG. 10, and thus, additional description will be omitted to avoid redundancy.

The third tap TAP3 may include a third photo transistor P3, fifth and seventh transfer transistors T31 and T32, a third storage transistor S3, and a third read circuit RC3. The fourth tap TAP4 may include a fourth photo transistor P4, sixth and eighth transfer transistors T41 and T42, a fourth storage transistor S4, and a fourth read circuit RC4. The third tap TAP3 and the fourth tap TAP4 are similar to the first tap TAP1 and the second tap TAP2 except that the third tap TAP3 and the fourth tap TAP4 respectively receive a third photo gate signal PG3 and a fourth photo gate signal PG4 having phases different from those of the first photo gate signal PG1 and the second photo gate signal PG2. For example, the first photo gate signal PG1 and the third photo gate signal PG3 may have a phase difference of 90 degrees, and the first photo gate signal PG1 and the fourth photo gate signal PG4 may have a phase difference of 270 degrees.

However, the one or more embodiments are not limited thereto and the first to fourth photo gate signals PG1 to PG4 may be shuffled. That is, the phase differences between each of the first photo gate signal PG1, the second photo gate signal PG2, the third photo gate signal PG3, and the fourth photo gate signal PG4 may be variously configured.

The first to fourth taps TAP1 to TAP4 may output image signals OUT1, OUT2, OUT3, and OUT4 having all phase information of 0 degree, 90 degrees, 180 degrees, and 270 degrees.

According to the present disclosure, a depth sensor and image detecting system including the same may reduce a toggle voltage difference of a photo gate signal by applying a negative voltage to a body of a pixel during an integration period. Accordingly, a driving current of a row driver may decreases. Thus, it is possible to reduce the power consumption of the depth sensor while securing the reliability of ToF calculation.

While the present disclosure has been described with reference to the embodiments and the accompanying drawings thereof, it will be apparent to those of ordinary skill in the art that various changes and modifications may be made thereto without departing from the spirit and scope of the present disclosure as set forth in the following claims.

What is claimed is:

1. A depth sensor comprising:
   a pixel configured to generate an image signal based on a sensed light, the pixel comprising:
   a first photo transistor configured to integrate first charges based on a first photo gate signal that toggles during an integration period;
   a second photo transistor configured to integrate second charges based on a second photo gate signal that toggles during the integration period;
   a first transfer transistor connected with the first photo transistor, and configured to transfer the first charges to a first floating diffusion node based on a first transfer gate signal;
   a second transfer transistor connected with the second photo transistor, and configured to transfer the second charges to a second floating diffusion node based on the first transfer gate signal; and
   a switch connected to a node to which the first photo transistor, the second photo transistor, the first transfer transistor, and the second transfer transistor are connected, and configured to control a voltage to be applied to the first photo transistor, the second photo transistor, the first transfer transistor, and the second transfer transistor.

2. The depth sensor of claim 1, wherein, during the integration period, the first photo transistor is configured to:
   integrate the first charges in response to the first photo gate signal having a low level, and
   transfer the integrated first charges in a first direction in response to the first photo gate signal having a high level.

3. The depth sensor of claim 2, wherein, during the integration period, the second photo transistor is configured to:
   integrate the second charges in response to the second photo gate signal having the low level, and
   transfer the integrated second charges in a direction facing away from the first direction in response to the second photo gate signal having the high level.

4. The depth sensor of claim 3, wherein a phase difference between a phase of the second photo gate signal and a phase of the first photo gate signal is 180 degrees.

5. The depth sensor of claim 1, wherein the first transfer transistor is configured to:
   transfer the first charges to the first floating diffusion node in response to the first transfer gate signal having a high level, and
   block the first charges being transferred to the first floating diffusion node in response to the first transfer gate signal having a low level.

6. The depth sensor of claim 1, wherein the second transfer transistor is configured to:
   transfer the second charges to the second floating diffusion node in response to the first transfer gate signal having a high level, and
   block the second charges being transferred to the second floating diffusion node in response to the first transfer gate signal having a low level.

7. The depth sensor of claim 1, wherein the switch is further configured to:
   operate in response to a switch control signal such that a negative voltage is applied to the first photo transistor, the second photo transistor, the first transfer transistor, and the second transfer transistor during the integration period; and operate in response to the switch control signal such that the negative voltage or a ground voltage is applied to the first photo transistor, the second photo transistor, the first transfer transistor, and the second transfer transistor during a period other than the integration period.

8. The depth sensor of claim 1, further comprising:
an overflow transistor connected in parallel with the first photo transistor and the second photo transistor,
wherein the overflow transistor is turned on during a period other than the integration period such that the first charges integrated by the first photo transistor and the second charges integrated by the second photo transistor are discharged.

9. The depth sensor of claim 1, wherein a low level of the first photo gate signal and the second photo gate signal is less than 0 V.

10. The depth sensor of claim 1, further comprising:
a third photo transistor connected in series between the first photo transistor and the second photo transistor,
wherein the third photo transistor is configured to integrate third charges based on a third photo gate signal of a given level during the integration period.

11. A depth sensor comprising:
a pixel configured to generate an image signal based on a sensed light, the pixel comprising:
a first photo gate electrode configured to receive a first photo gate signal that toggles during an integration period to integrate first charges in a light detecting area;
a second photo gate electrode configured to receive a second photo gate signal that toggles during the integration period to integrate second charges in the light detecting area;
a first transfer gate electrode disposed to be spaced apart from the first photo gate electrode in a first direction, and configured to receive a first transfer gate signal to transfer the first charges to a first floating diffusion node;
a second transfer gate electrode disposed to be spaced apart from the second photo gate electrode in a second direction facing away from the first direction, and configured to receive the first transfer gate signal to transfer the second charges to a second floating diffusion node; and
a substrate comprising the light detecting area, the first floating diffusion node, and the second floating diffusion node,
wherein a negative voltage is applied to the substrate during the integration period.

12. The depth sensor of claim 11, wherein the substrate further comprises:
a first bridging diffusion area disposed between the light detecting area and the first floating diffusion node; and
a second bridging diffusion area disposed between the light detecting area and the second floating diffusion node.

13. The depth sensor of claim 12, wherein, based on the first photo gate electrode receiving the first photo gate signal of a low level, the light detecting area integrates the first charges, and
wherein, based on the first photo gate electrode receiving the first photo gate signal of a high level, the light detecting area transfers the integrated first charges to the first bridging diffusion area in which the integrated first charges are stored.

14. The depth sensor of claim 12, wherein, based on the second photo gate electrode receiving the second photo gate signal of a low level, the light detecting area integrates the second charges, and
wherein, based on the second photo gate electrode receiving the second photo gate signal of a high level, the light detecting area transfers the integrated second charges to the second bridging diffusion area in which the integrated second charges are stored.

15. The depth sensor of claim 14, wherein a phase difference between a phase of the second photo gate signal and a phase of the first photo gate signal is 180 degrees.

16. The depth sensor of claim 12, wherein, based on the first transfer gate electrode receiving the first transfer gate signal of a high level, the first bridging diffusion area transfers the first charges to the first floating diffusion node, and
wherein, based on the second transfer gate electrode receiving the first transfer gate signal of the high level, the second bridging diffusion area transfers the second charges to the second floating diffusion node.

17. The depth sensor of claim 11, wherein a silicon oxide layer is formed on an upper surface of the substrate, and
wherein the first photo gate electrode, the second photo gate electrode, the first transfer gate electrode, and the second transfer gate electrode are disposed over the silicon oxide layer.

18. The depth sensor of claim 11, wherein the first photo gate electrode and the second photo gate electrode extend in a direction perpendicular to an upper surface of the substrate.

19. The depth sensor of claim 11, wherein the substrate further comprises a deep trench isolation (DTI), and
wherein the DTI is configured to inhibit the first charges and the second charges of the pixel from being transferred to another pixel adjacent to the pixel.

20. An image detecting system comprising:
a light source configured to output an emission light based on a first clock signal;
a depth sensor comprising a pixel and configured to generate an image signal by sensing the emission light reflected from an object based on the first clock signal and a second clock signal complementary to the first clock signal during an integration period; and
a processor configured to calculate a distance between the depth sensor and the object based on the image signal,
wherein the pixel comprises:
a first photo transistor configured to integrate first charges based on a first photo gate signal that toggles during the integration period;
a second photo transistor configured to integrate second charges based on a second photo gate signal that toggles during the integration period;
a first transfer transistor connected with the first photo transistor, and configured to transfer the first charges to a first floating diffusion node based on a first transfer gate signal;
a second transfer transistor connected with the second photo transistor, and configured to transfer the second charges to a second floating diffusion node based on the first transfer gate signal; and
a switch connected to a node to which the first photo transistor, the second photo transistor, the first transfer transistor, and the second transfer transistor are connected, and configured to control a voltage to be applied to the first photo transistor, the second photo transistor, the first transfer transistor, and the second transfer transistor.

* * * * *